United States Patent [19]

Inada et al.

[11] Patent Number: 5,690,750
[45] Date of Patent: Nov. 25, 1997

[54] CLEANING METHOD AND CLEANING APPARATUS

[75] Inventors: Minoru Inada, Yokohama; Yasutaka Imajo, Hachioji; Masahide Uchino, Ohizumigakuenmachi, all of Japan

[73] Assignee: Kabushiki Kaisha Toshiba, Kawasaki, Japan

[21] Appl. No.: 455,890

[22] Filed: May 31, 1995

Related U.S. Application Data

[63] Continuation of Ser. No. 355,312, Dec. 12, 1994, Pat. No. 5,593,507, which is a continuation of Ser. No. 842,169, filed as PCT/JP91/01113, Aug. 22, 1991, abandoned.

[30] Foreign Application Priority Data

| Aug. 20, 1990 | [JP] | Japan | 2-229221 |
| Aug. 22, 1990 | [JP] | Japan | 2-220304 |
| Sep. 12, 1990 | [JP] | Japan | 2-241974 |
| Sep. 12, 1990 | [JP] | Japan | 2-241975 |
| Jan. 21, 1991 | [JP] | Japan | 3-20471 |

[51] Int. Cl.[6] ............... B08B 3/08; B08B 3/10; B08B 3/12; B08B 5/00
[52] U.S. Cl. ............... 134/11; 134/1; 134/10; 134/19; 134/26; 134/30; 134/31; 134/32; 134/40; 134/42
[58] Field of Search ............... 134/26, 27, 31, 134/34, 1, 10, 11, 19, 30, 32, 40, 42

[56] References Cited

U.S. PATENT DOCUMENTS

| 3,193,499 | 7/1965 | Carr | 252/8.55 |
| 3,249,550 | 5/1966 | Metters | 252/161 |
| 3,498,922 | 3/1970 | Zisman | 252/171 |
| 3,498,923 | 3/1970 | Zisman et al. | 252/171 |
| 3,511,708 | 5/1970 | Zisman | 134/40 |
| 3,516,938 | 6/1970 | Zisman | 252/171 |
| 3,903,012 | 9/1975 | Brandreth | 252/194 |
| 3,904,430 | 9/1975 | Tipping et al. | 134/11 |
| 4,091,826 | 5/1978 | Bahrke | 134/11 |
| 4,166,305 | 9/1979 | Gustafsson et al. | 134/30 |
| 4,168,714 | 9/1979 | Bahrke | 134/60 |
| 4,169,807 | 10/1979 | Zuber | 252/171 |
| 4,247,330 | 1/1981 | Sanders, Jr. | 106/3 |
| 4,290,896 | 9/1981 | Gordon | 210/710 |
| 4,400,288 | 8/1983 | Dhanani . | |
| 4,501,682 | 2/1985 | Goodman et al. | 252/174.15 |
| 4,677,178 | 6/1987 | Okada et al. | 528/34 |
| 4,685,930 | 8/1987 | Kasprzak | 8/139.1 |
| 4,708,807 | 11/1987 | Kemerer | 252/8.6 |

(List continued on next page.)

FOREIGN PATENT DOCUMENTS

| 0 160 854 | 11/1985 | European Pat. Off. . |
| 182583 | 5/1986 | European Pat. Off. . |

(List continued on next page.)

OTHER PUBLICATIONS

Handbook of Surface Preparation, R.C. Snogren, (1974), pp. 111–112, 311, 423–425.

Perry's Chemical Engineers Handbook, 6th ed., (1984), pp. 20–25.

(List continued on next page.)

*Primary Examiner*—Ponnathapura Achutamurthy
*Attorney, Agent, or Firm*—Foley & Lardner

[57] ABSTRACT

A part subjected to cleaning is cleaned or rinsed with a cleaning agent or rinsing agent having a nonaqueous type solvent or a hydrophilic solvent as a main component thereof. Then the cleaning agent or rinsing agent adhering to the cleaned or rinsed part subjected to cleaning is removed with a cleaning agent having perfluorocarbon as a main component thereof or the vapor of the cleaning agent. The part is subsequently dried. Otherwise, after the part subjected to cleaning has been cleaned with an aqueous type solvent or wash with water, the part is cleaned and dried with a cleaning agent having perfluorocarbon as a main component thereof or the vapor of the cleaning agent. The cleaning agent having perfluorocarbon as a main component thereof or the vapor of the cleaning agent can be used for cleaning or rinsing the part subjected to cleaning.

88 Claims, 9 Drawing Sheets

U.S. PATENT DOCUMENTS

| | | | |
|---|---|---|---|
| 4,778,532 | 10/1988 | McConnell et al. | 134/30 |
| 4,784,799 | 11/1988 | Petroff | 252/545 |
| 4,795,840 | 1/1989 | Torii et al. | 585/16 |
| 4,810,253 | 3/1989 | Kasprzak et al. | 8/137 |
| 4,960,533 | 10/1990 | Wisniewskie et al. | 252/174.15 |
| 4,985,155 | 1/1991 | Yamada et al. | 252/8.6 |
| 5,055,138 | 10/1991 | Slinn | 134/11 |
| 5,080,824 | 1/1992 | Bindle et al. | 134/40 |
| 5,183,067 | 2/1993 | Slinn | 134/61 |

FOREIGN PATENT DOCUMENTS

| | | |
|---|---|---|
| 0 183 109 | 6/1986 | European Pat. Off. . |
| 0 199 288 | 10/1986 | European Pat. Off. . |
| 0 246 007 | 11/1987 | European Pat. Off. . |
| 0 350 316 | 1/1990 | European Pat. Off. . |
| 351185 | 1/1990 | European Pat. Off. . |
| 352783 | 1/1990 | European Pat. Off. . |
| 0 381 887 | 9/1990 | European Pat. Off. . |
| 422787 | 4/1991 | European Pat. Off. . |
| 2418681 | 9/1979 | France . |
| 2634799 | 2/1990 | France . |
| 17 53 849 | 3/1976 | Germany . |
| 25 41 613 | 3/1977 | Germany . |
| 3321289 | 12/1984 | Germany . |
| 3739711 | 6/1989 | Germany . |
| 37-6688 | 6/1937 | Japan . |
| 42-22269 | 12/1942 | Japan . |
| 53-56203 | 5/1978 | Japan . |
| 53-0132173 | 11/1978 | Japan . |
| 54-118404 | 9/1979 | Japan . |
| 54-124010 | 9/1979 | Japan . |
| 57-115499 | 7/1982 | Japan . |
| 48-34515 | 7/1983 | Japan . |
| 59-17160 | 4/1984 | Japan . |
| 59-39162 | 9/1984 | Japan . |
| 60-28880 | 7/1985 | Japan . |
| 61-119765 | 6/1986 | Japan . |
| 61-231272 | 10/1986 | Japan . |
| 62-273299 | 11/1987 | Japan . |
| 62-286583 | 12/1987 | Japan . |
| 62-286915 | 12/1987 | Japan . |
| 63-15889 | 1/1988 | Japan . |
| 63-107788 | 7/1988 | Japan . |
| 63-50463 | 10/1988 | Japan . |
| 63-63884 | 12/1988 | Japan . |
| 1-239175 | 9/1989 | Japan . |
| 1-304032 | 12/1989 | Japan . |
| 1-311198 | 12/1989 | Japan . |
| 2-73896 | 3/1990 | Japan . |
| 2-184302 | 7/1990 | Japan . |
| 2-191581 | 7/1990 | Japan . |
| 2-91688 | 7/1990 | Japan . |
| 3-042002 | 2/1991 | Japan . |
| 3-42002 | 2/1991 | Japan . |
| 786920 | 12/1980 | U.S.S.R. . |
| 2173508 | 10/1986 | United Kingdom . |
| 2188059 | 9/1987 | United Kingdom . |
| 2238793 | 6/1991 | United Kingdom . |
| WO 89/119024 | 12/1989 | WIPO . |
| PCT/JA91/ 0035 | 3/1991 | WIPO . |
| WO 91/06621 | 5/1991 | WIPO . |

OTHER PUBLICATIONS

Encyclopedia Chemical technology, Kirk–Othmer, (1980), vol. 10, pp. 897–900.

Encyclopedia Chemical technology, Kirk–Othmer, (1983), vol. 21, pp. 355–376.

Kasprzak, "Volatile Siliscones New Cleaners for Oils and Greases", Soap/Cosmetics/Chemical Specialities, Dec. 1986, pp. 40–43.

"Actual Conditions of the Selection and Development of Glass Washing Detergent..." Soft Gilsen Publication, Mar. 15, 1994.

"Information about Silicone Fluids", Dow Corning Corporation, 1978.

Oba, Yoichi, "The Design By Glass Surface," Publisher Kinai Henshusha, 1983, pp. 236–265.

CLEANING METHOD AND CLEANING APPARATUS

This application is a continuation of application Ser. No. 08/355,312, filed Dec. 12, 1994, now U.S. Pat. No. 5,593, 507 which is a continuation of Ser. No. 07/842,169 filed Apr. 1, 1992 now abandoned, which is the national stage of PCT/JP91/01113 filed Aug. 22, 1991.

FIELD OF THE INVENTION

This invention relates to a cleaning method and a cleaning apparatus which cause little environmental pollution and operate with high safety.

BACKGROUND OF THE INVENTION

Description of Related Art

Various parts such as metallic parts, plated parts, coated parts, electronic parts, and semiconductor parts suffer adhesion thereto of machine oil and other similar fouling substances while they are in the process of manufacture or assemblage. It has been customary for these defiled parts to be cleaned with fluorinated hydrocarbon (hereinafter referred to briefly as "Freon") type solvents and chlorine type solvents because of their outstanding cleaning power and their nonflammability and consequent freedom from the danger of ignition. As parts subjected to special cleaning, such parts as semiconductor wafers and LCD quality substrates which abhor a water mark intensely and demand ultraprecision cleaning are cited. In the field of cleaning of parts under discussion, the vapor washing (in the drying process) as with Freon 113 has been heretofore adopted as the finishing step of cleaning.

Recently, since the effects which Freon type solvents produce on human bodies and the environment have come to raise a grave issue, however, the desirability of a cleaning method which permits ultraprecision cleaning comparable favorably with that obtainable with a Freon type solvent and avoids exerting any adverse effect on the environment has been finding enthusiastic recognition.

As prospective substitutes for the Freon type solvents, various cleaning aqueous and nonaqueous types have been proposed. For example, the development of Freon type substances having a lower ozone destruction coefficient than the existing Freon type solvents is now under way and the study of feasibility of the aqueous cleaning and the cleaning with an organic solvent containing no chlorine is also under way. The feasibility of using vapor drying with isopropyl alcohol (hereinafter referred to briefly as "IPA"), hot air drying, etc. in the place of vapor drying with Freon type solvents has been under study.

Many of the substitute cleaning agents mentioned above are defective in respect that while they are indeed capable of cleaning given surfaces, the surfaces cleaned therewith are required to be rinsed. The organic type substitute cleaning agents are defective in the sense that they often manifest on human bodies not negligible toxicity. Newly developed Freon type substances are not absolutely incapable of environmental pollution and, therefore, are not regarded as preferred substitutes.

For example, after a given part has been cleaned with an aqueous type cleaning agent and rinsed with water, it is necessary for quality cleaning that the surface of the cleaned part wet with adhering water should be uniformly and quickly dried. By the conventional method for forcibly vaporizing the water as by the hot air drying, however, the prevention of a water mark is very difficult to achieve.

The vapor drying with IPA is indeed capable of yielding comparatively favorable results. When the preceding step is executed by the use of an aqueous cleaning agent and an agent adapted for rinsing, there arises the disadvantage that since water and IPA have close boiling points, the water is removed only with great difficulty from IPA and the water mingling in IPA is liable to form a water mark. This drawback, coupled with the fact that many of the substitute cleaning agents mentioned above require the parts cleaned therewith to be rinsed with water, constitutes an obstacle on the way of practical utility of the method of vapor drying with IPA. Further, IPA is defective in respect that since it has a lower flash point 11.7° C. than normal room temperature, it always entails the possibility of catching fire under normal conditions of use. Further, since IPA exhibits high toxicity to human bodies, an increasingly rigid restriction is imposed on its use in the field of cleaning.

In the circumstances, an earnest desire has been expressed for the development of a cleaning method which produces as effective cleaning as the method resorting to the use of a Freon type solvent without entailing any environmental pollution and which particularly obviates the necessity for using a nonaqueous cleaning treatment anywhere throughout the entire process of cleaning. In the field requiring ultraprecision cleaning, the desirability of a cleaning method which imparts to the cleaned part as high resistance to water mark as attainable by the vapor cleaning with a Freon type solvent without entailing any environmental pollution has been finding enthusiastic recognition.

Many of the non-aqueous type solvents which are regarded as promising substitutes for Freon type cleaning agents are inflammable substances. When the part which has been cleaned with such an inflammable solvent is simply subjected to drying by heating or to vapor drying as with the IPA, therefore, the inflammable solvent adhering to the part has the possibility of catching fire. To preclude this danger, the practice of blowing air on the cleaned part thereby expelling the adhering inflammable solvent from the part is now in vogue. This practice, however, is very uneconomical because the inevitable release of the air impregnated heavily with the inflammable solvent into the ambient air threatens air pollution or fire and even aggravates the consumption of the solvent.

In the circumstances, in respects to the use of an inflammable solvent as a cleaning agent, the desirability of a safe and economical cleaning method which precludes the possibility of entailing air pollution or fire and allows effective recovery of the cleaning agent after use has been finding enthusiastic recognition.

SUMMARY OF THE INVENTION

This invention, conceived in the urge to cope with the problems encountered by the prior art as described above, has as one object thereof the provision of a cleaning method and a cleaning apparatus which produce as high cleaning effect as the cleaning with a Freon type solvent or the cleaning by vapor drying and diminish the possibility of environmental pollution. Another object of this invention is to provide, in the field necessitating superprecision cleaning, a cleaning method and a cleaning apparatus which allows impartation to the cleaned part as high resistance to water mark as attained by the vapor cleaning with a Freon type solvent and, at the same time, avoid entailing any environmental pollution. Yet another object of this invention is to provide a safe and economical cleaning method which, in the use of the inflammable solvent as a cleaning agent, precludes the danger of air pollution or fire and allows effective recovery of the used cleaning agent.

The first cleaning method of this invention is characterized by effecting the cleaning of the part, the rinsing of the cleaned part, and the drying of the wet cleaned part with a cleaning agent having a perfluorocarbon as a main component or the vapor of this cleaning agent.

The second cleaning method is characterized by comprising the step of cleaning a part by the use of a cleaning agent containing a nonaqueous type solvent or an aqueous type solvent and the step of rinsing the cleaned part with a rinsing agent having a perfluorocarbon as a main component thereof thereby removing the cleaning agent adhering to the surface of the cleaned part.

The third cleaning method is characterized by comprising the step of cleaning a part by the use of a cleaning agent containing a nonaqueous type solvent or an aqueous type solvent and the step of drying the wet cleaned part by the use of the vapor of a vapor cleaning agent having a perfluorocarbon as a main component.

The cleaning apparatus of this invention is characterized by comprising an apparatus proper furnished as laid therein with a conveying mechanism for parts subjected to cleaning and provided with an inlet and an outlet for the conveying mechanism, cleaning means disposed on the inlet side of the conveying mechanism inside the apparatus proper, and drying means disposed on the outlet side of the conveying mechanism inside the apparatus proper and adapted to operate with the vapor of a cleaning agent having a perfluorocarbon as a main component thereof.

DETAILED DESCRIPTION OF PREFERRED EMBODIMENTS

The cleaning agent having a perfluorocarbon as a main component thereof and used for this invention is capable of effectively drying the wet cleaned part and, at the same time, capable of cleaning the part and rinsing the cleaned part. Further, after the part has been cleaned with an aqueous type cleaning agent and then rinsed as with water, the cleaning agent contemplated by this invention can be used effectively for removing the water adhering to the surface of the cleaned part, though this removal of the adhering water partly overlaps the aforementioned work of drying.

The perfluorocarbon mentioned above is a compound in which all the substitutes joinable to the carbon atoms in the molecular configuration thereof are fluorine atoms. Generally, it assumes a liquid state at normal room temperature. In some of the commercially manufactured species of perfluorocarbon, however, these substituents are not fluorine atoms but may partly include hydrogen, chlorine, or bromine atoms as impurities. These impurities are unavoidable by reason of manufacture. They are contained in such species of perfluorocarbon in a proportion approximately in the range of from 0.5% to 5.0%. The impurities contained in this proportion offer no hindrance to the practical utility of the perfluorocarbon. The perfluorocarbon contemplated by this invention, therefore, embraces the species containing these impurities. Further, the perfluorocarbon for use in this invention is not restricted to that which has a main chain formed solely of carbon atoms but is allowed to partly contain an oxygen atom in the form of an ether linkage or a nitrogen atom, a silicon atom, etc.

The perfluorocarbon of the quality is nonflammable, nontoxic, and odorless and enjoys very high safety. Since it contains substantially no chlorine, it has no possibility of entailing environmental pollution. Further, since it possesses volatility comparable with that of a Freon type solvent and avoids corroding various materials including metals, plastics, and glass, it manifests cleaning and drying effects effectively and fully satisfactorily on parts made of various materials.

The perfluorocarbon is immiscible with various solvents including water and excluding fluorine type solvents. Even if such an immiscible cleaning agent finds its way in the cleaning step or rinsing step using the perfluorocarbon, therefore, it can be recovered and put to reuse without difficulty. A commercially available species of perfluorocarbon, for example, has a specific gravity approximately in the range of from 1.6 to 2.0 at 25° C., a value larger than the specific gravities of ordinary nonaqueous type solvents and aqueous type solvents. By virtue of this difference in specific gravity, therefore, the perfluorocarbon can be separated by sedimentation. As a result, the recovery for reuse of both the perfluorocarbon and the cleaning agent or rinsing agent can be attained. When the cleaning agent having the perfluorocarbon as a main component thereof is used for the removal of water adhering to a surface, for example, owing to a large difference in specific gravity between the perfluorocarbon and water, the removal of the adhering water and the drying of the wet cleaned part can be effectively carried out and, at the same time, the separation of the perfluorocarbon from the water can be accomplished. Optionally, the separation of the perfluorocarbon from the cleaning agent or the rinsing agent may be accomplished by distillation owing to their different boiling points.

The perfluorocarbons which are effectively usable in this invention include those represented by the general formula, $C_nF_{2n+2}$ (wherein N stands for an integer in the range of from 4 to 12), those represented by such molecular formulas as $C_3F_6$, $C_4F_8$, $C_5F_{10}$, $C_6F_{12}$, $C_6F_{12}O$, $C_6F_{14}$, $C_7F_{14}$, $C_7F_{14}O$, $C_7F_{16}$, $C_8F_{16}O$, $C_8F_{18}$, $C_9F_{18}O$, and $C_{10}F_{20}O$, and those represented by such structural formulas as

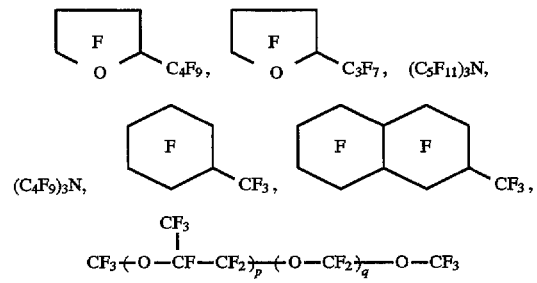

(wherein p and q severally stand for an arbitrary integer), for example. These perfluorocarbons are usable singly or in a mixture in this invention. As commercially available products, Florinate FC-72 (b.p. 56° C.), ditto FC-84 (b.p. 80° C.), ditto FC-77(b.p. 97° C.), ditto FC-75 (b.p. 102° C.), ditto FC-40 (b.p. 155° C.), and ditto FC-43 (b.p. 174° C.) [produced by Sumitomo-3M K. K.], Garuden D 80 (b.p. 84° C.), ditto D100 (b.p. 102° C.), and ditto D01 (b.p. 110° C.) [produced by Nippon Montedison K. K.], Afflude E-8(b.p. 82° C.) and ditto E-10 (b.p. 100° C.) [produced by Asahi Glass. Company, Ltd.)], and Technocare FRV-1 (b.p. 100° C.; produced by Kabushiki Kaisha Toshiba) may be cited, for example. Such commercially available products of various perfluorocarbons as various Garuden series produced by 3M Company of the U.S.A., various Garuden series produced by Montedison of Italy, and various Technocare FRV series produced by Kabushiki Kaisha Toshiba are similarly usable herein.

The perfluorocarbons are producible with varying boiling points, depending on chemical structure. For use in the drying step, a given perfluorocarbon is desired to have a boiling point of not less than 20° C. lower than the boiling point of the cleaning agent to be used in the cleaning step. This difference in boiling point prevents the cleaning agent from adhering again to the cleaned part in the drying step. This difference in boiling point is desired to be not less than 50° C., preferably not less than 100° C.

The perfluorocarbon liquid described above may be used by itself or as mixed with auxiliary agents. The auxiliary agents mentioned above include a solvent which is added to the perfluorocarbon for the purpose of enhancing the cleaning ability thereof when the cleaning power exhibited by the perfluorocarbon alone to the defiling substances remaining on the cleaned part is not sufficient and a solvent which is added thereto for the purpose of enhancing the water-removing ability thereof when the ability manifested by the perfluorocarbon by itself in removing the water remaining on the cleaned part is not sufficient, for example.

As examples of the auxiliary agents, terpene type solvents, hydrocarbon type solvents, silicone type solvents, kerosene, Freon type solvents, nonaqueous type solvents such as chlorine type organic solvents, and hydrophilic solvents such as alcohols may be cited. It is naturally desirable to avoid using such Freon type solvents as Freon 113 and such chlorine type organic solvents as 1,1,1-trichloromethane on account of environmental pollution and poor safety. Their adverse effects on the environment, however, can be alleviated to a large measure by the use of the perfluorocarbon as a main component of the cleaning agent. When the perfluorocarbon is used in combination with such auxiliary agents as mentioned above, the total amount of the auxiliary agents to be incorporated is desired to be not more than 70% by volume, preferably not more than 50% by volume, and ideally not more than 30% by volume, based on the amount of the perfluorocarbon. Specifically, the ease with which the object of this invention is accomplished is increased by lowering the degree of influence of the Freon type solvent upon the environment below 0.7, preferably below 0.5, and ideally below 0.3 (FIG. 10). When an inflammable solvent is used as an auxiliary agent, it is desired to have a boiling point higher than the boiling point of the perfluorocarbon.

At the cleaning step of this invention, the cleaning agent to be used therein may be selected so as to suit the nature of cleaning aimed at such as, for example, the cleaning for removal of grease, the cleaning for removal of water, or the precision cleaning. To be specific, this cleaning step allows use of the aforementioned cleaning agent having a perfluorocarbon as a main component, nonaqueous type cleaning agents having such nonaqueous type solvents as silicone type solvents, hydrocarbon type solvents, terpene type solvents, and kerosene as a main component, hydrophilic type cleaning agents having such hydrophilic solvents as alcohol type solvents as a main component, and water-soluble cleaning agents such as alkali type cleaning agents, neutral type cleaning agents, and acid type cleaning agents. As concrete cleaning means, an immersion bath or a shower bath may be used optionally in combination with ultrasonic waves, vibrations, or mechanical agitation, for example.

The solvents which are usable as a main component for the cleaning agent described above will be explained in detail below. As a silicone type solvent among the nonaqueous type solvents, at least one low molecular polyorganosiloxane selected from the group consisting of linear polydiorganosiloxanes represented by the general formula:

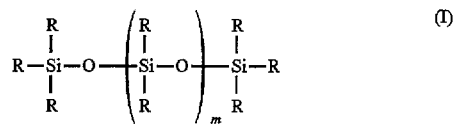

(wherein R's independently stand for a substituted or unsubstituted monovalent hydrocarbon group and m stands for an integer in the range of from 0 to 5) and cyclic polydiorganosiloxanes represented by the general formula:

(wherein R's independently stand for a substituted or unsubstituted monovalent hydrocarbon group and n stands for an integer in the range of from 3 to 7) may be cited.

The low molecular polyorganosiloxane mentioned above by itself exhibits excellent penetrating power and volatility in delicate contours of such parts subjected to cleaning as metallic parts, electronic parts, semiconductor parts, and coated parts, imparts rustproofness to the cleaned parts, and manifests highly satisfactory replaceability with water. A polydiorganosiloxane of a linear structure represented by the formula (I) and a polydiroganosiloxane of a cyclic structure represented by the formula (II) may be used together in a combined form. In the formula (I) and the formula (II) mentioned above, R's independently stand for a substituted or unsubstituted monovalent hydrocarbon group. Unsubstituted monovalent hydrocarbon groups like alkyl groups such as methyl, ethyl, propyl, and butyl and a phenyl group and substituted monovalent hydrocarbon groups such as trifluoromethyl may be cited as concrete examples. In point of stability of the formed system and maintenance of volatility, methyl proves to be the best choice.

As hydrocarbon type solvents, those of alkylbenzene type solvents and paraffin type solvents which possess volatility may be cited. They may be used either singly or in the form of a mixture of two or more members. As paraffin type solvents effectively usable herein, volatile isoparaffins having 1 to 30 carbon atoms may be cited. Among other volatile isoparaffins, the isoparaffins having fractions of $C_3$ to $C_{15}$ as a main component prove to be particularly desirable in point of the cleaning ability. These hydrocarbon type solvents possess volatility, enjoy harmlessness and odorlessness, and manifest the same effectiveness as the aforementioned low molecular polyorganosiloxanes. The terpene type solvents are formed mainly of oil extracted from oranges.

As hydrophilic solvents which are usable as a main component of the cleaning agent contemplated by this invention, such alcohol type solvents as higher alcohol type solvents and polyhidric alcohol type solvents may be cited.

The nonaqueous type solvent described above exhibits a cleaning ability even in its simple form. Depending on the purpose of use, it is desired to be used as mixed with a cleaning ability-improving agent which is capable of imparting and enhancing the cleaning ability of the solvent. When the cleaning ability-improving agent is used, the cleaned part is desired to be subjected to a rinsing treatment with a silicone type solvent or a hydrocarbon type solvent or with a perfluorocarbon. This rinsing treatment contributes to facilitating the work of drying by the use of a vapor cleaning agent having a perfluorocarbon as a main component.

As cleaning ability-improving agents which are effectively usable for such nonaqueous type solvents as silicone type solvents and hydrocarbon type solvents, surfactants and hydrophilic solvents which possess compatibility with such agents may be cited. The surfactants are classified by chemical structures responsible for manifestation of their activities under cation type, anion type, nonionic type, amphoteric type, and composite type. This invention allows use of these surfactants without reference to their types.

The surfactant particularly contributes to improving the cleaning ability of the cleaning agent.

In these surfactants, those which are used particularly desirably include anionic surfactants represented by polyoxyalkylene alkylether sulfonates and phosphoric esters, nonionic surfactants represented by polyhydric alcohol fatty acid esters, polyoxyalkylene fatty acid esters and polyoxyalkylene alkyl ethers, amphoteric surfactans represented by imidazoline derivatives, and cationic surfactans represented by alkylamine salts and alkyl quaternary ammonium salts, for example. Terpene type solvents and higher fatty acid esters are also usable. Further, the synthetic compounds having part of the chemical structures of the various compounds mentioned above substituted by fluorine atoms or silicon atoms are also usable.

The hydrophilic solvents which have flash points exceeding 40° C. prove to be particularly desirable in point of ease of use. The hydrophilic solvents include polyhydric alcohols such as ethylene glycol monomethyl ether, ethylene glycol monoethyl ether, ethylene glycol monopropyl ether, ethylene glycol monobutyl ether, ethylene glycol monobutyl ether acetate, and diethylene glycol monobutyl ether and derivatives of these polyhydric alcohols, for example.

In the use of the cleaning agent which incorporates therein the cleaning ability-improving agent, the mixing ratio of the cleaning ability-improving agent is not particularly restricted. The mixing ratio of the surfactant is desired to be not more than 20 parts by weight, preferably not more than 3 parts by weight, to 100 parts by weight of the nonaqueous type solvent. The mixing ratio of the hydrophilic type solvent is desired to be not more than 100 parts by weight, preferably not more than 50 parts by weight, to 100 parts by weight of the nonaqueous type solvent.

Illustrated cleaning ability-improving agents effectively usable particularly for terpene type solvents as nonaqueous type solvents include terpene type emulsion surfactants.

In the cleaning method of this invention, the cleaning step for removal of grease or for removal of water is desired to be followed by a rinsing step using a rinsing agent selected from among the aforementioned nonaqueous type solvents containing a perfluorocarbon, lower alcohols such as methanol and ethanol, ordinary hydrophilic solvents such as acetone and methylethyl ketone, and water.

Particularly where a cleaning agent having as a main component thereof an inflammable solvent like a terpene type solvent, a hydrocarbon type solvent, a silicone type solvent, kerosene, or an alcohol type solvent is used in the cleaning step, a rinsing treatment with a rinsing agent having a perfluorocarbon as a main component thereof yields a highly desirable result. The work of rinsing with perfluorocarbon is effected by immersing in the rinsing agent a part which has undergone the cleaning step, spouting the rinsing agent against the surface of the cleaned part, or exposing the cleaned part to the vapor obtained by heating the rinsing agent. These rinsing methods may be employed together simultaneously.

By performing the rinsing treatment with a perfluorocarbon as described above, the inflammable solvent adhering to the surface of the cleaned part is separated from the cleaned part and then allowed to mingle into the rinsing agent having as a main component thereof a perfluorocarbon so that the inflammable solvent is removed. As a result, the drift of the inflammable solvent in the ambient air can be curbed to a marked extent and the possibility of the inflammable solvent entailing air pollution or catching fire can be diminished in a large measure. Further, since the perfluorocarbon is compatible with the cleaning agent to be used in this invention as described above, the perfluorocarbon and the cleaning agent can be separated from each other and recovered independently of each other. As a result, the perfluorocarbon conspicuously contributes to minimizing the consumption of the cleaning agent and enhancing the economy of the cleaning operation.

The cleaning step and the rinsing step by the use of the inflammable solvent described above are desired to be carried out in an atmosphere of the inflammable vapor produced by thermally vaporizing the perfluorocarbon. In this matter, the cleaning and the rinsing with the inflammable solvent can be effected in the atmosphere which contains no oxygen or very little oxygen. Since the vapor of the perfluorocarbon has a larger specific gravity than air, the escape of the inflammable gas from the atmosphere or the mingling thereof in the ambient air can be prevented. Thus, the possibility of these steps entailing air pollution or fire is diminished to a great extent and, at the same time, the cleaning operation can be performed with high efficiency.

In the rinsing step of this invention, an alcohol type solvent may be used as a rinsing agent. In this case, the alcohol type solvent is desired to be used as cooled to below the flash point of the solvent. The drying of the cleaned part can be performed more easily by using an alcohol type solvent having a lower boiling point in the place of the nonaqueous type solvent of a relatively high boiling point. The alcohol type solvent suffered to adhere to the cleaned part in this case is inflammable. By subjecting the cleaned part coated with the inflammable solvent to drying by heating in the atmosphere of the vapor of the cleaning agent having a perfluorocarbon as a main component, however, the danger of the adhering inflammable solvent catching fire can be eliminated and the work of drying can be carried out with added safety.

The drying step of this invention is effected by exposing the cleaned part having the cleaning agent and the rinsing agent deposited on the surface thereof to the vapor produced by heating the aforementioned vapor cleaning agent, i.e. the cleaning agent having a perfluorocarbon as a main component thereof. On the surface of the cleaned part, the vapor of perfluorocarbon remains in the form of dews until the temperature of the cleaned part reaches the boiling point of perfluorocarbon. Owing to the difference in specific gravity between the perfluorocarbon and the cleaning agent or the rinsing agent, the cleaning agent and the rinsing agent are removed from the cleaned part. Since the adhering perfluorocarbon is readily volatilized, the cleaned part is dried in a clean state.

In the cleaning method of this invention, particularly in the cleaning step thereof, the nonaqueous cleaning operation throughout the entire process can be accomplished by using in the cleaning step a nonaqueous cleaning agent having as a main component thereof a nonaqueous type solvent such as a perfluorocarbon, a silicone type solvent, a hydrocarbon type solvent, a terpene type solvent, or kerosene and, where the cleaned part demands a rinsing treatment, using in the rinsing step a rinsing agent having a similar nonaqueous type solvent and subjecting the cleaned and rinsed part to vapor drying with a vapor cleaning agent having a perfluorocarbon as a main component.

The cleaning apparatus contemplated by this invention physically embodies one example of the cleaning method of this invention described above. In the cleaning apparatus of this invention, the apparatus proper is formed in a hermetically sealed construction and this apparatus proper is provided therein with partition means for dividing the interior of the apparatus proper into two chambers. The two separated chambers are desired to be provided severally with air discharge means adapted to establish negative pressure inside the apparatus proper. The cleaning apparatus thus constructed precludes leakage therefrom of the vapor cleaning agent having a perfluorocarbon as a main component thereof, the cleaning agent, or the rinsing agent. Owing to the preclusion of the leakage coupled with the fact that the cleaning agent of this invention having a perfluorocarbon as a main component thereof and various solvents used therein are not compatible with each other and, therefore, can be recovered separately of each other, the amounts of these materials to be consumed can be reduced.

The parts to be cleaned by the cleaning method with the cleaning apparatus both of this invention are parts of metallic materials, ceramics materials, and plastic materials. More particularly, these parts include metallic parts, surface-treated parts, electronic parts, semiconductor parts, electrical parts, precision mechanical parts, optical parts, glass parts, and ceramic parts, for example.

DETAILED DESCRIPTION OF THE INVENTION

Now, the present invention will be described more specifically below with reference to embodiments thereof.

Figure 1:
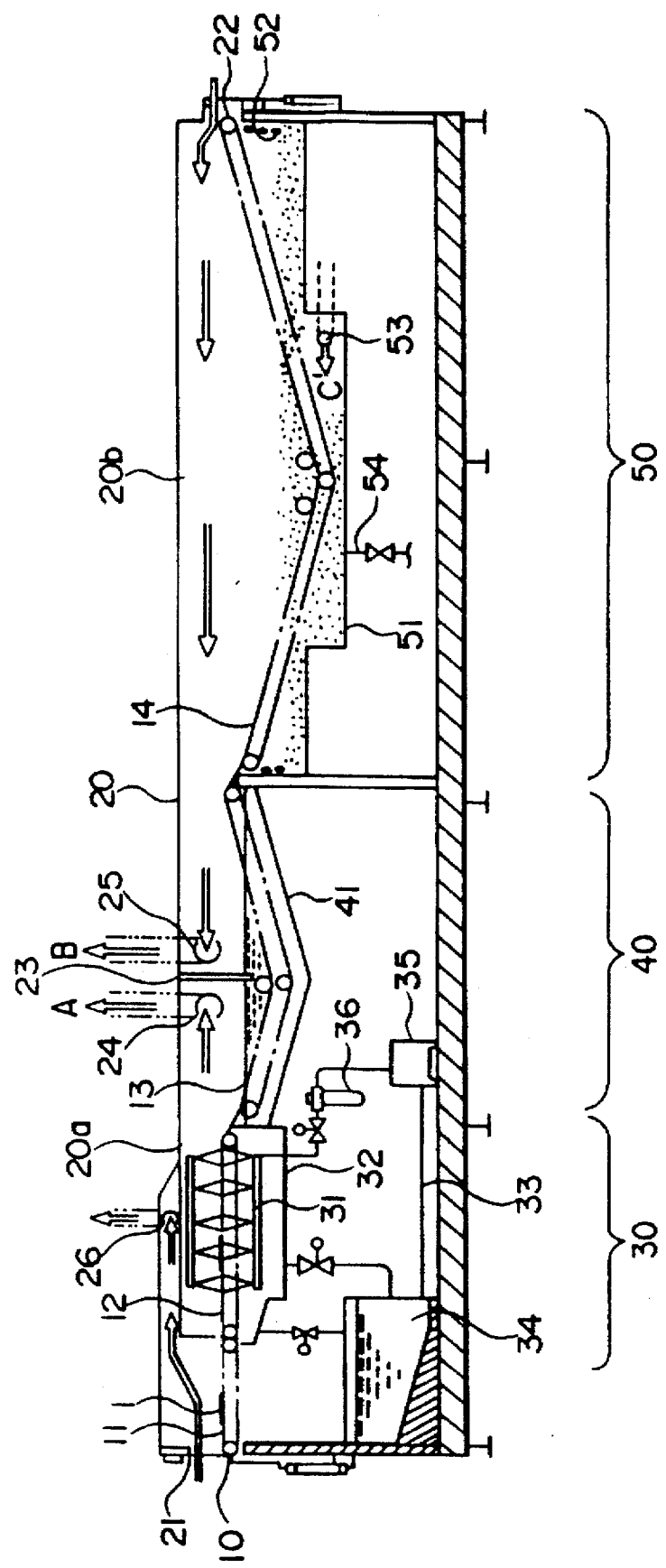
FIG. 1 is a diagram illustrating the construction of a cleaning apparatus as one embodiment of this invention.

FIG. 1 is a diagram illustrating the construction of a cleaning apparatus constructed to execute a cleaning method as one embodiment of this invention. The cleaning apparatus illustrated in the diagram is provided, inside an apparatus proper 20 incorporating therein a belt conveyor as means 10 for conveying a part 1 subjected to cleaning, with shower cleaning means 30 intended for a cleaning step, immersion rinsing means 40 intended for a rinsing step, and drying means 50 adapted to operate with the vapor of a vapor cleaning agent having a perfluorocarbon as a main component thereof and intended for a drying step, with the means 30, 40, and 50 laid sequentially in the order mentioned along the direction of travel of the conveying means 10.

The apparatus proper 20 is formed in a hermetically sealed construction except for an inlet part 21 and an outlet part 22 of the conveying means 10. The interior of the apparatus proper 20 is divided into two chambers 20a, 20b with a partition panel 23 disposed on the rinsing means 40. To the anterior chamber 20a and the posterior chamber 20b separated by the partition panel 23 are respectively connected air-discharging systems 24, 25. Thus, the chambers independently aspirate the ambient air via open parts (the inlet part 21 and the outlet part 22) of the apparatus proper 20. By consequently establishing negative pressure inside the anterior chamber 20a and the posterior 20b, the leakage of the vapor such as of a perfluorocarbon from the apparatus proper 20 is precluded and the recovery for reuse of the perfluorocarbon is realized.

In the shower cleaning means 30, a conveyor 12 for the cleaning step connected to an inlet side conveyor 11 serves to convey the part 1 subjected to cleaning. The shower cleaning means 30 incorporates therein a shower cleaning bath 32 which is provided with a plurality of shower nozzles 31 disposed so as to blow a cleaning agent against the part 1 in conveyance from the opposite lateral sides. By the shower cleaning, such defiling substances as grease and water adhering to the part 1 under treatment are removed.

The cleaning agent mentioned above is selected to suit the purpose of cleaning or the kind of part subjected to cleaning. For example, a nonaqueous cleaning agent produced by adding to a silicon type solvent like Technocare FRW-13 (b.p. 176° C.; produced by Kabushiki Kaisha Toshiba) a surfactant as a cleaning ability-improving agent and a nonaqueous type cleaning agent produced by adding to a silicone type solvent like Technocare FRW-14 (b.p. 176° C.) or FRW-15 (b.p. 178° C.) (produced by Kabushiki Kaisha Toshiba) a polyhydric alcohol as a cleaning ability-improving agent are used. The shower cleaning bath 32 is connected to a reserve tank 34 through the medium of a pipe 33. From this reserve tank 34, the cleaning agent is circulated by a pump 35 through the site of service. A filter 36 is inserted in the pipe 33. This filter 36 deprives the cleaning agent flowing therethrough of such defiling substances as solid particles and undissolved substances.

The rinsing means 40 is provided with an immersion rinsing bath 41 holding therein a rinsing agent variable with the purpose of rinsing. A conveyor 13 intended for the rinsing step is laid in such a manner that the part 1 to be cleaned may pass the interior of the immersion rinsing bath 41. The cleaning agent and ionic dirt adhering to the part 1 which has passed through the shower cleaning means 30 are rinsed off from the part 1 by the passage of the part 1 through the interior of the immersion rinsing bath 41. As the rinsing agent, Technocare FRW-1 formed solely of a silicone type solvent (b.p. 176° C.; produced by Kabushiki Kaisha Toshiba), or Technocare FRV-1 formed of perfluorocarbon (b.p. 100° C.; produced by Kabushiki Kaisha Toshiba), for example, is used.

To the immersion rinsing bath 41 is connected a circulation system which is omitted from the diagram. By means of a cleaning liquid-purifying device adapted to effect extraction from water, for example, the used rinsing agent is purified. The extraction from water suffices to attain purification of the used rinsing agent because the cleaning ability-improving agent and ionic dirt mingling in the rinsing liquid formed of a silicone type solvent or a perfluorocarbon can be extracted from water. Owing to the cleaning liquid-purifying device, the rinsing agent is always kept in a clean state.

The drying means 50 is composed mainly of a drying furnace 51 for maintaining the vapor cleaning agent formed mainly of perfluorocarbon in the form of vapor depending on the boiling point of the perfluorocarbon and a cooling pipe 52 laid above the drying furnace 51 so as to prevent the vapor of perfluorocarbon from diffusing out of the drying furnace 51. Further, a conveyor 14 intended for the drying step is laid in such a manner that the part 1 subjected to cleaning may pass the interior of the drying furnace 51 which is filled as with the vapor of perfluorocarbon mentioned above.

Figure 2:
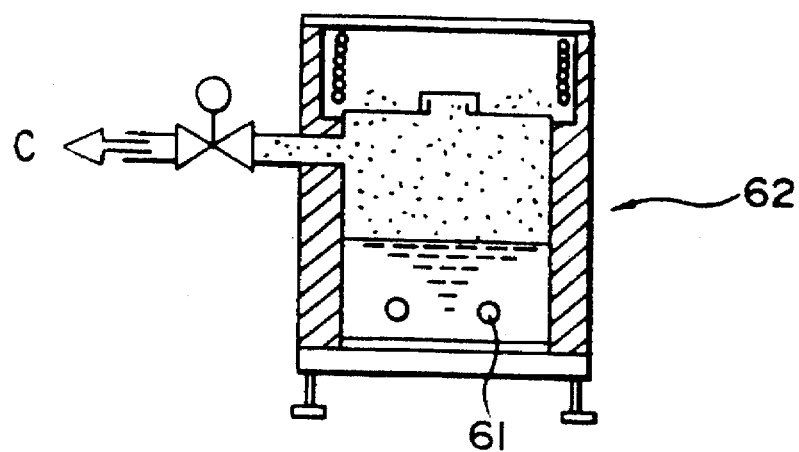
FIG. 2 is a diagram schematically illustrating the construction of a device for vaporizing a vapor cleaning agent having a perfluorocarbon as a main component and used in the cleaning apparatus illustrated in FIG. 1.
Figure 3:
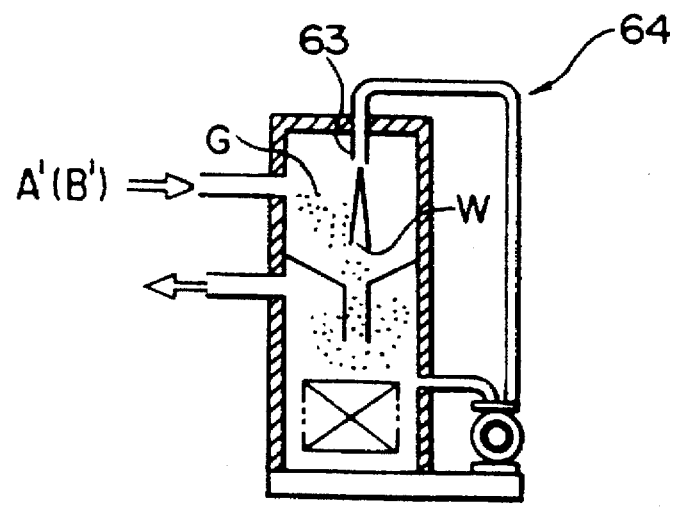
FIG. 3 is a diagram schematically illustrating the construction of a cleaning agent recovery device to be used in the cleaning apparatus illustrated in FIG. 1.

The vapor cleaning agent having a perfluorocarbon as a main component is vaporized by a vaporizer 62 which is provided with a heater 61 as illustrated in FIG. 2 and the resultant vapor is supplied via a vapor inlet 53 into the drying furnace 51. As the vapor cleaning agent formed mainly of a perfluorocarbon, one member selected from among Florinate FC-72, ditto FC-84, ditto FC-77, and ditto FC-75 and Technocare FRV-1 may be used.

On the part 1 conveyed by the conveyor 14 for the drying step into the drying furnace 51 filled with the vapor such as of perfluorocarbon, the vapor of perfluorocarbon remains thereon in the form of dews until the temperature thereof reaches the boiling point of perfluorocarbon and serves to rinse off the rinsing agent adhering to the surface of the part 1. By the time the temperature of the part 1 rises beyond the boiling point of perfluorocarbon, nothing is remaining any further on the surface of the part 1. Thus, the cleaned part is conveyed out of the apparatus in a dry state. The rinsing agent removed by the vapor cleaning mentioned above is discharged through a drain vent 54 disposed below the drying furnace 51, deprived of defiling substances as by extraction from water, and then separated into the silicone type solvent and the perfluorocarbon and put to use independently of each other. This separation of the silicone type solvent and the perfluorocarbon is accomplished by sedimentation resorting to difference in specific gravity or by centrifugation, for example.

The air-discharge systems 24, 25 installed in the apparatus proper 20 are severally connected to cleaning agent-recovering devices 64 which are provided with a shower mechanism 63 adapted to establish contact between the water used for extraction of the cleaning agent component and the aspirated air. The cleaning agent-recovering device 64 connected to the anterior chamber 20a side air-discharge system 24 permits exclusive separation for recovery and reuse of the water-insoluble silicone type solvent by blowing water W against the aspirated gas G thereby effecting extraction of the cleaning ability-improving agent from water. The cleaning agent-recovering device 64 connected to the posterior chamber 20b side air-exhaust system 25 permits mutual separation for recovery and reuse of the water-insoluble silicone type solvent and the perfluorocarbon by similarly subjecting the cleaning ability-improving agent to extraction from water. To the inlet part 21 side of the apparatus proper 20 is connected a separate air-discharge system 26 adapted to enhance the efficiency of the recovery such as of the cleaning agent.

Figure 4:
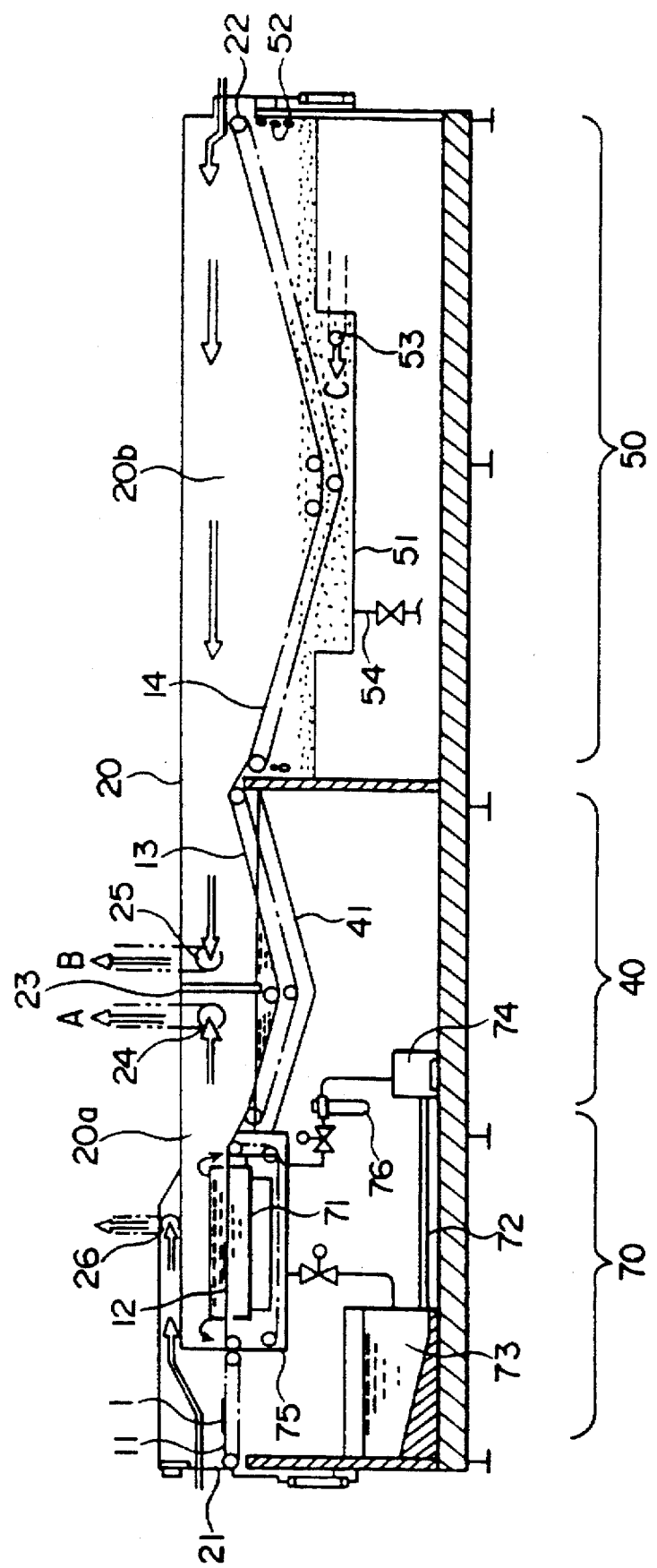
FIG. 4 is a diagram illustrating the construction of a cleaning apparatus as another embodiment of this invention.

The embodiment given thus far concerns a cleaning apparatus which uses a shower cleaning means 30 for the cleaning step. The apparatus may optionally use an ultrasonic immersion cleaning means 70 as illustrated in FIG. 4. The cleaning apparatus illustrated in FIG. 4 has the same construction as the cleaning apparatus illustrated in FIG. 1, except for the use of the ultrasonic immersion cleaning means 70.

The ultrasonic immersion cleaning means 70 is provided with an ultrasonic immersion bath 71 having the conveyor 12 for the cleaning step laid therethrough. The passage of the part 1 subjected to cleaning inside this ultrasonic immersion bath 71 results in the removal of such defiling substances as grease and water adhering to the part 1. The cleaning agent used in this case is the same as that used in the preceding embodiment. To the ultrasonic immersion bath 71, the cleaning agent from a reserve tank 73 is incessantly supplied by a pump 74 via a pipe 72 so that it will overflow the bath 71. The cleaning agent overflowing the ultrasonic immersion bath 71 is returned from a buffer tank 75 to the reserve tank 73. A filter 76 inserted in the pipe 72 serves to remove such defiling substances as solid particles and undissolved substances entrained in the cleaning agent.

Now, the results of a cleaning test performed by using a cleaning apparatus constructed as illustrated in FIG. 1 for the removal of flux will be described below.

Circuit substrates having various species of flux stuck thereto were cleaned by three minutes' shower cleaning, three minutes' rinsing, and six minutes' drying, using Technocare FRW-14 and FRW-15 as silicone type cleaning agents incorporating therein a polyhydric alcohol in the shower cleaning means 30, Technocare FRW-1 as a silicone type cleaning agent in the rinsing means 40, and Florinate FC-75 as a perfluorocarbon type solvent in the drying means. The results of the cleaning and the kinds of flux are shown in Table 1. The results of cleaning were visually rated on the three-point scale, wherein ⊚ stands for thorough cleaning, ○ for nearly satisfactory cleaning, and α for insufficient cleaning.

TABLE 1

| | Shower cleaning agent | |
|---|---|---|
| kind of flux | FRW-14 | FRW-15 |
| Rosin type (PO-F-4900) | ○ | ⊚ |
| Rosin type (PO-F-4600) | ○ | ⊚ |
| Rosin type (PO-F-1010S) | ○ | ⊚ |
| Rosin type (PQ-Z-7) | ⊚ | ⊚ |
| Water-soluble flux (WF-57) | ○ | ⊚ |
| Water-soluble flux (WF-37) | Δ | ⊚ |
| Rosin type (Delta Lux 507) | ⊚ | ⊚ |

The perfluorocarbon type solvent used in the test mentioned above was tested for resistance to water mark by the following method. The results are shown in Table 2. The comparative experiments whose results are also shown in this table used Freon 113 and isopropyl alcohol as conventional vapor cleaning agents.

(a) Resistance to water mark

Various substrates (stainless steel sheet, ceramics, polycarbonate, and Ni-plated steel sheet) were cleaned in the same manner as in the cleaning test described above and then subjected to vapor drying under the same conditions as above. The comparative experiments were carried out under the same conditions. Then, the surfaces of the cleaned substrates were examined in point of water mark visually and under a scanning electron microscope and evaluated on the four-point scale, wherein XX stands for destruction caused by corrosion on a substrate during the draining step made the substrate no longer evaluable, x for presence of visually discernible water mark, for absence of visually discernible water mark, and ⊚ for absence of water mark exceeding 50 μm under the scanning electron microscope.

(b) Continuous water-marking property

A stainless steel sheet as a substrate was subjected to 50 rounds of drying test and, after the test, the surface of the cleaned substrate was examined in the same manner as in (a) above.

TABLE 2

|  | Example | Comparative Experiment | |
| --- | --- | --- | --- |
|  | Perfluorocarbon (FC-75) | Freon 113 | Isopropyl alcohol |
| Water-marking property |  |  |  |
| Stainless steel sheet | ⊚ | ⊚ | ○ |
| Ceramics | ⊚ | ○ | ○ |
| Polycarbonate | ⊚ | ⊚ | xx |
| Ni-plated steel sheet | ⊚ | ⊚ | ○ |
| Continuous water-marking Property | ⊚ | ⊚ | ○ |

It is clearly noted from the results of the test described above that the cleaning apparatus using vapor cleaning with a cleaning agent having the aforementioned perfluorocarbon as a main component thereof permitted thorough removal of flux by nonaqueous cleaning, exhibited ideal resistance to water mark, and allowed superprecision cleaning. This fact indicates that the cleaning agent is satisfactorily usable as a substitute for Freon type solvents. Since this cleaning apparatus uses a cleaning agent which, unlike a Freon type solvent, is incapable of causing any environmental pollution and contains substantially no chlorine, it allows a marked decrease in the adverse effects on the environment and avoids manifesting any adverse effect on human bodies and enables desired cleaning to be carried out with high safety.

Further, in the cleaning apparatus constructed as described above, since the apparatus proper has the interior thereof kept under negative pressure owing to evacuation and protected against leakage of the cleaning agent and the perfluorocarbon and since the gas discharged from the apparatus is deprived of such components for recovery, the effect upon the ambience can be minimized and the otherwise waste of the cleaning agent and perfluorocarbon can be prevented. Since the cleaning apparatus excels safety and permits efficient and advantageous use of the cleaning agent, it attains a generous saving in the consumption of the cleaning agent and contributes to lowering the running cost.

The test (evaluation) described above represented a case involving the combination of a cleaning step resorting to a silicone type solvent containing a cleaning ability-improving agent and a rinsing step resorting solely to a silicone type solvent. The effect of the cleaning step described above may be similarly obtained by using in this step a silicone type solvent alone, a cleaning agent having perfluorocarbon as a main component thereof, or a hydrophilic solvent, depending on the kind of the part subjected to cleaning or the kind of defiling substance. When a cleaning agent having perfluorocarbon as a main component is used in the cleaning step, a Freon type solvent or a chlorine type organic solvent may be used as the vapor cleaning agent in the drying step.

Incidentally, the cleaning apparatus of the preceding embodiment illustrated in FIG. 1 and FIG. 4 has been described with respect to a case in which the cleaning agent used in the cleaning steps 30, 70, is purged by means of the filter 36. The purgation of the used and defiled cleaning agent may be otherwise accomplished by the operation of distillation. If the cleaning agent used in this case happens to be an inflammable solvent, the distillation is desired to be carried out in an atmosphere of the inactive vapor obtained by heating perfluorocarbon.

Figure 5:
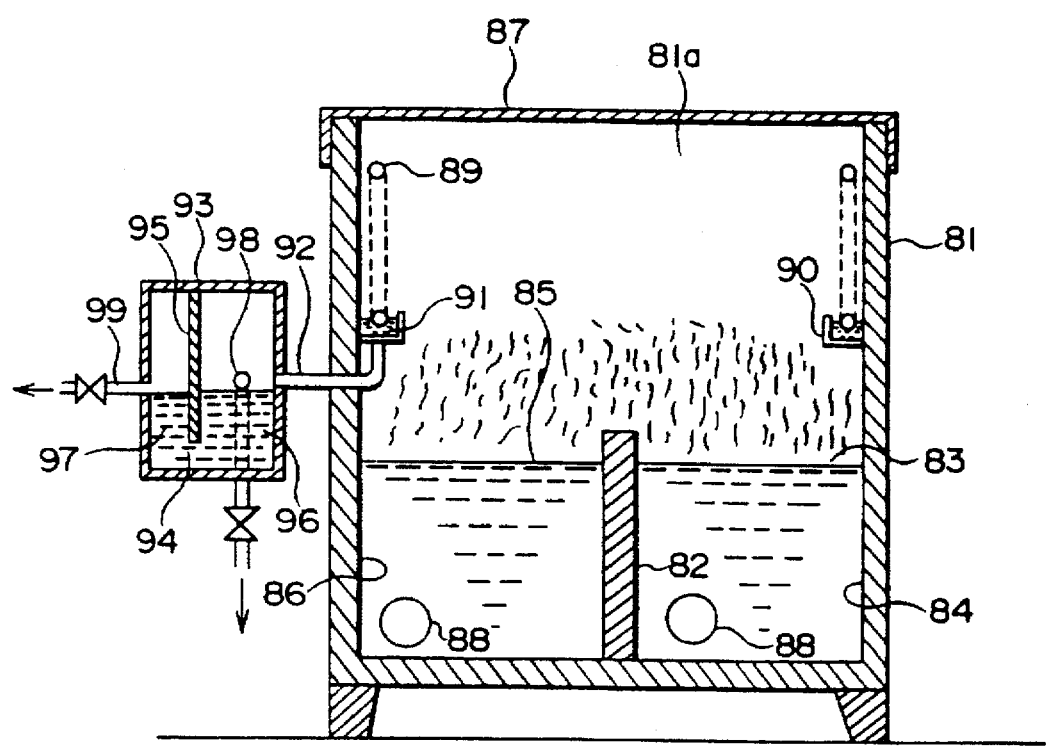
FIG. 5 is a cross section illustrating the construction of a device for distillation of a defiled cleaning agent.

FIG. 5 illustrates one example of a distillation device for the inflammable solvent. The interior of a distillation device proper 81 is divided by a partition wall 82 into a defiled liquid container bath 84 for accommodating therein a used and defiled cleaning agent 83, i.e. the cleaning agent containing the inflammable solvent defiled by use, and an inactive bath 86 to be filled with a perfluorocarbon liquid 85. An upper opening part 81a of the distillation device proper 81 is tightly closed with a lid 87. The defiled liquid container bath 84 and the inactive bath 85 are provided therein severally with heating sources 88 adapted to heat and vaporize the liquids contained in the baths.

The distillation device proper 81 is provided on the inner wall surface on the upper opening part 81a side with a condensing part 89 formed of a cooling coil, for example, and used for condensing the vapor. This condensing part 89 is provided in the lower end thereof with a trough-like condensate receiving part 90 raised annularly from the inner wall surface of the distillation device proper 81. To the condensate receiving part 90 is connected an outlet conduit 92 adapted to lead out of the distillation device proper 81 the condensate 91 produced by cooling the vapor by the condensing part 89. This outlet conduit 92 is connected to a separator 93.

The vapor of the defiled cleaning agent 83 and the perfluorocarbon liquid 85 is condensed by being cooled by the condensing part 89 and the liquefied condensate 91 is recovered by the condensate receiving part 90. The condensate 91 thus recovered is divided by the separator 93 into an inflammable solvent and a perfluorocarbon liquid.

The separator 93 is provided therein with a partition wall 95 which is furnished in the lower end thereof with a communicating passage 94. By the partition wall 95, the interior of the separator 93 is divided into an inflammable solvent chamber 96 and a perfluorocarbon liquid chamber 97. The outlet conduit 92 is connected to the inflammable solvent chamber 96. Inside this separator 93, the condensate 91 is separated by difference in specific gravity into an inflammable solvent and perfluorocarbon.

To the inflammable solvent chamber 96 is connected an overflow pipe 98 serving for the inflammable solvent separated from the condensate 91. By the overflow pipe 98, the inflammable solvent is recovered. To the perfluorocarbon liquid chamber 97 is connected an overflow pipe 99 serving for the perfluorocarbon liquid separated from the condensate 91. By the overflow pipe 99, the perfluorocarbon is recovered as it accumulates to a prescribed volume.

In the distillation device, the used and defiled cleaning agent 83 is vaporized by heating after the interior of the distilling device proper 81 has been filled with the vapor of perfluorocarbon. The vapor of the defiled cleaning agent 83, i.e. the vapor of the inflammable solvent, threatens the danger of fire in its normal state. The distillation device of the present embodiment has only a very remote possibility of causing a fire and enjoys remarkably high safety because the device is filled in advance with the vapor of inactive perfluorocarbon and the interior of the distillation device proper 81 is kept in a state completely lacking oxygen or containing oxygen only meagerly.

When the defiled liquid container bath 84 disposed inside the distillation device proper 81 is installed inside the inactive bath 86 instead, the trouble entailed in separately heating the defiled cleaning liquid 83 and the perfluorocarbon liquid 85 can be avoided. The distillation device mentioned above, besides being used for the operation of distillation, can be used as vapor cleaning means (such as, for example, the drying means 50 in the apparatus of FIG. 1) by virtue of the vapor formed in consequence of the operation of distillation.

In the cleaning apparatus of the embodiment described above, when an inflammable solvent is used in the cleaning means 30 and 70 and the rinsing means 40 and particularly when the inflammable solvent and air are liable to mingle as during the shower cleaning, the possibility of the inflammable solvent catching fire can be avoided by cleaning the part subjected to cleaning with a cleaning agent having the inflammable solvent as a main component thereof in an atmosphere of the nonflammable vapor obtained by vaporizing perfluorocarbon.

Figure 6:
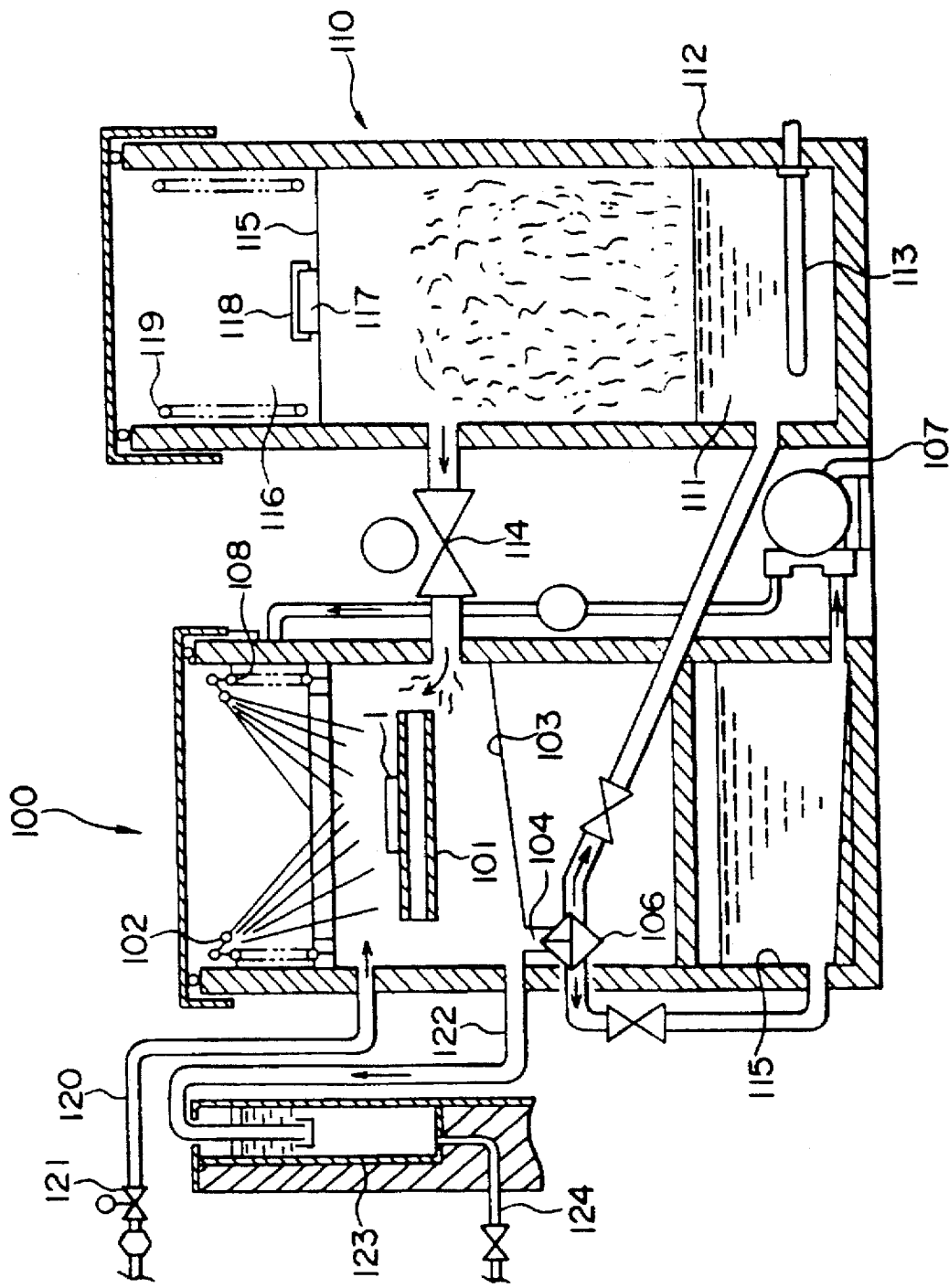
FIG. 6 is a diagram illustrating a modification of cleaning means.

A perfluorocarbon vapor generating device 110 is installed as juxtaposed to a shower cleaning device 100 as illustrated in FIG. 6. The shower cleaning device 100, similarly to the shower cleaning means 30 in the cleaning apparatus illustrated in FIG. 1, is provided with a plurality of shower nozzles 102 adapted to blow the cleaning agent against the part 1 subjected to cleaning which is being conveyed by a conveyor 101. Below the conveyor 101 is disposed an inclined receiving part 103 for the cleaning agent. A recovery inlet 104 for the cleaning agent and a reserve tank 105 which are disposed in the lower bottom of the receiving part 103 are interconnected via a three-way valve 106. To the reserve tank 105 is connected an air pump 107. This air pump 107 enables the cleaning agent to be cyclically used.

The vapor generating device 110 mentioned above possesses an inactive liquid bath 112 containing perfluorocarbon 111. A heater 113 for vaporizing the perfluorocarbon 111 is thrust into the inactive liquid bath 112 from outside. The vapor generating device 110 and the shower cleaning device 100 are made to intercommunicate via a switch 114 to permit supply of the vaporized perfluorocarbon into the shower cleaning device 100.

On the vapor generating device 110 is superposed a condensing chamber 116 through the medium of a partition wall 115. A communicating hole 117 formed in the partition wall 115 is covered to be opened or shut with an inner lid 118 of a stated weight. Inside the condensing chamber 116, a cooling coil 119 for condensing the vapor is installed.

In the upper part of the shower cleaning device 100, a cooling coil 108 is helically disposed and utilized to cool and condensate the supplied vapor of perfluorocarbon. To the shower cleaning device 100, an inlet path 120 for introducing the ambient air when necessary is connected via a switch valve 121. To the shower cleaning device 100, an outlet path 122 for guiding out of the device the introduced ambient air and the vapor of perfluorocarbon is connected. This outlet path 122 is plunged into a water tank 123 filled with water. A recovery vent 124 is connected to the bottom of the water tank 123 to render possible the recovery of the inflammable solvent and perfluorocarbon which have larger specific gravities than water.

In the shower cleaning device 100 of this sort, the vapor of the inflammable solvent can be prevented from catching fire by having this device 100 filled in advance with the vapor of perfluorocarbon, keeping the interior of the shower cleaning device 100 in a state completely lacking oxygen or containing oxygen only meagerly, and carrying out the shower cleaning in an atmosphere of this vapor. The recovery of the vapor of perfluorocarbon after the cleaning is completed can be attained by cooling and condensing the vapor of perfluorocarbon with the cooling coil 108 and then advancing the resultant condensate via the three-way valve 106 into the inactive liquid bath 112.

The preceding embodiment has been described with respect to a case in which the shower cleaning device 100 possessing the vapor generating device 110 is incorporated in a continuous cleaning apparatus. When the shower cleaning device described above is used as a batchwise cleaning device, for example, the operation of vapor cleaning with the vapor of perfluorocarbon can be continuously performed after the operation of shower cleaning.

Figure 7:
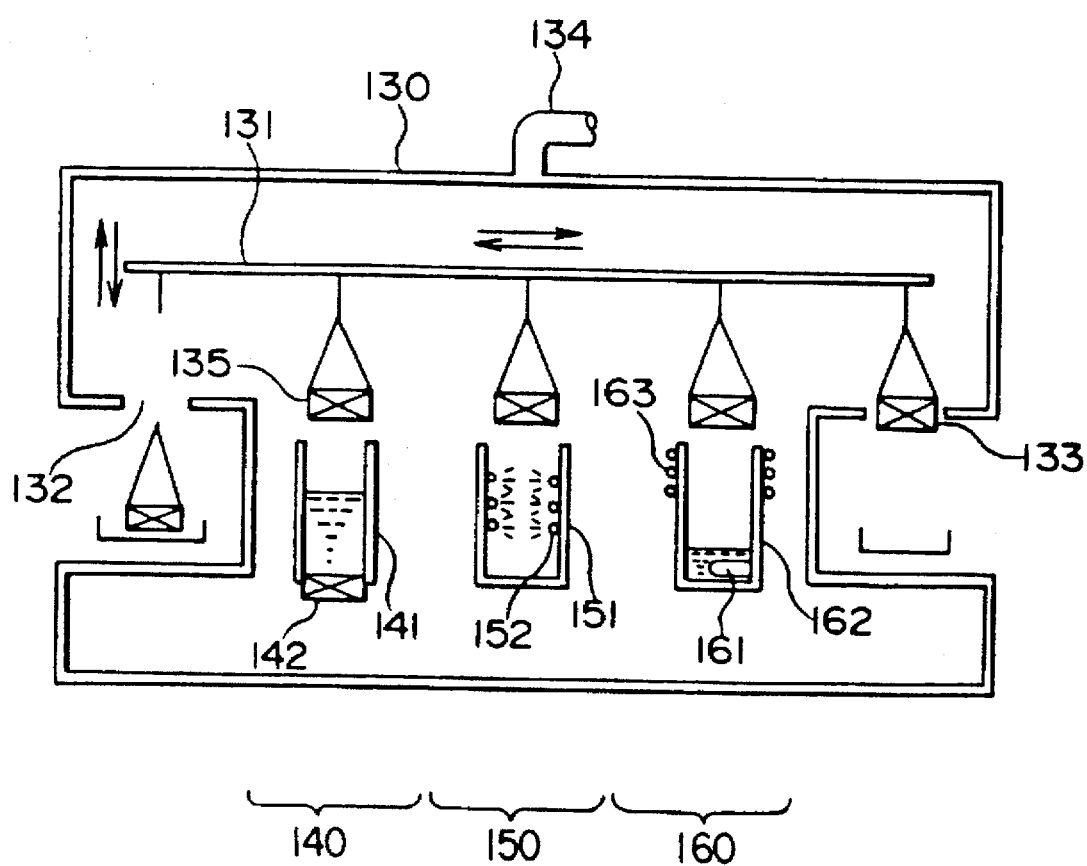
FIG. 7 is a diagram illustrating the construction of a cleaning apparatus as still another embodiment of this invention.

Now, another embodiment of this invention will be described below with reference to FIG. 7. FIG. 7 illustrates the construction of a cleaning apparatus for applying this invention to the operation of draining and the operation of drying by simple washing with water or by the use of an aqueous type cleaning agent after the cleaning operation.

Inside a cleaning apparatus proper 130, a basket conveying mechanism 131 is installed as conveying means for a part subjected to cleaning. Along the path for conveyance of the basket conveying mechanism 131 in the direction of travel thereof, immersing draining means 140 using a cleaning agent having perfluorocarbon as a main component thereof, shower draining means 150 using the same cleaning agent, and drying means 160 using the vapor of a cleaning agent having perfluorocarbon as a main component are disposed sequentially in the order mentioned.

The apparatus proper 130 mentioned above has a tightly sealed construction except for an inlet part 132 and an outlet part 133 of the basket conveying mechanism 131. An air discharge system 134 is connected to the apparatus proper 130 of a tightly sealed construction. By establishing negative pressure inside the apparatus proper 130, the air discharge system 134 prevents the vapor of perfluorocarbon from leaking out of the apparatus proper and, at the same time, enables the perfluorocarbon to be recovered and put to reuse.

The immersion draining means 140 mentioned above possesses an immersion bath 141 containing a cleaning agent having perfluorocarbon as a main component thereof. The parts which are conveyed by the basket conveying mechanism 131 as contained in baskets 135 have been either cleaned by a separately installed cleaning device using an aqueous cleaning agent or rinsed with water. The defiling substances such as water which adhere to the surface of the parts subjected to cleaning are removed by immersing the parts in the cleaning agent having perfluorocarbon as a main component thereof.

This removal of water is realized by the fact that the water floats up to the surface of the perfluorocarbon liquid owing to the difference in specific gravity between the perfluorocarbon and water. Where the removal of water by the difference in specific gravity is not sufficient, the water adhering to the surface of the parts subjected to cleaning is supplemented as by the use of the mechanical energy of ultrasonic waves generated by an ultrasonic wave oscillator 142 installed inside the immersion bath 141.

The shower draining means 150 comprises a shower cleaning bath 152 which possesses a plurality of shower nozzles 151 laid so as to blow a cleaning agent having perfluorocarbon as a main component thereof against the parts subjected to cleaning. In consequence of this shower cleaning, the defiling substances such as water which remain on the surface of the parts subjected to cleaning are removed. Even when these defiling substances are suffered to adhere again to the parts in consequence of the immersion cleaning mentioned above, they are removed from the parts by the shower cleaning. The removal of the defiling water by this shower cleaning is realized as by the fact that the water remaining on the surface of the parts subjected to cleaning is hurled away by the kinetic energy caused by the difference in specific gravity between the perfluorocarbon and water.

The various species of perfluorocarbon mentioned previously herein are available for the cleaning agent having perfluorocarbon as a main component thereof and used in the immersion rinsing device 140 and the shower rinsing device 150.

The drying means 160 is composed of a vapor cleaning bath 162 possessing a vapor generating part 161 adapted to vaporize the perfluorocarbon and a cooling pipe 163 set in place in the upper part of the vapor cleaning bath 162 so as to prevent the vapor of perfluorocarbon from diffusing out of the vapor cleaning bath 162. On the surface of the parts subjected to cleaning which have been conveyed into the vapor cleaning bath 162 filled with the vapor of perfluorocarbon, the vapor of perfluorocarbon is retained in the form of dews until the temperature of the parts subjected to cleaning reaches the boiling point of perfluorocarbon. When the temperature of the parts subjected to cleaning reaches the boiling point of perfluorocarbon, the perfluorocarbon begins to vaporize, with the result that the parts subjected to cleaning are conveyed out of the cleaning apparatus in a state no longer having any defiling substance adhering to the surface thereof.

Even when water adheres in an extremely minute amount to the surface of the part subjected to cleaning, this water can be removed because the vapor of perfluorocarbon is retained in the form of dews on the surface of the part subjected to cleaning and the dews, while trickling down the surface of the part subjected to cleaning, scrub the water off the surface. The removal of this water can be otherwise attained by causing the latent heat of the vapor of perfluorocarbon to elevate the temperature of the water and that of the part subjected to cleaning and induce conversion of water into steam.

Though the perfluorocarbon to be used in the drying means 160 is variable with the vapor pressure thereof, it is desired to possess a boiling point not exceeding the boiling point of water. This is because the water adhering to the surface of the part subjected to cleaning effervesces and possibly causes water mark on the surface when the part subjected to cleaning is brought into an atmosphere of a temperature exceeding the boiling point.

By the use of a draining device constructed as described above, various substrates having defiling water deposited on the surface thereof were cleaned and dried under the conditions of three minutes' immersion cleaning, three minutes' shower cleaning, and three minutes' drying with Technocare FRV-1 (a proprietary product of Kabushiki Kaisha Toshiba) used as the perfluorocarbon type solvent in the immersion draining means 140, as the perfluorocarbon type solvent in the shower draining means 150, and as the perfluorocarbon type solvent in the drying means 160. The cleaned substrates were evaluated with respect to resistance to water mark on the same scale as used previously herein. The results are shown in Table 3.

TABLE 3

|  | Example | Comparative Experiment | |
| --- | --- | --- | --- |
|  | Perfluorocarbon (FC-75) | Freon 113 | Isopropyl alcohol |
| Water-marking property | | | |
| Stainless steel sheet | ◎ | ◎ | ○ |
| Ceramics | ◎ | ○ | ○ |
| Polycarbonate | ◎ | ◎ | xx |
| Ni-plated steel sheet | ◎ | ◎ | ○ |

It is clearly noted from the results of evaluation given above that the draining device using the cleaning agent having perfluorocarbon as a main component thereof effected through removal of defiling water from the surface of the parts subjected to cleaning, kept the parts against infliction of water mark, permitted untroprecision cleaning, and consequently proved comparable favorably with the coutnertype device using Freon type solvent.

Further, the cleaning apparatus constructed as described above minimizes the exertion of an adverse effect on the environment and avoids needless loss of perfluorocarbon because the apparatus is prevented from leakage of the perfluorocarbon and enabled to recover the perfluorocarbon from the discharged air. Since this apparatus excels Operational safety and attains efficient and effective use of the cleaning agent, therefore, it permits a generous reduction in the consumption of the cleaning agent and contributes to lowering the running cost.

Figure 8:
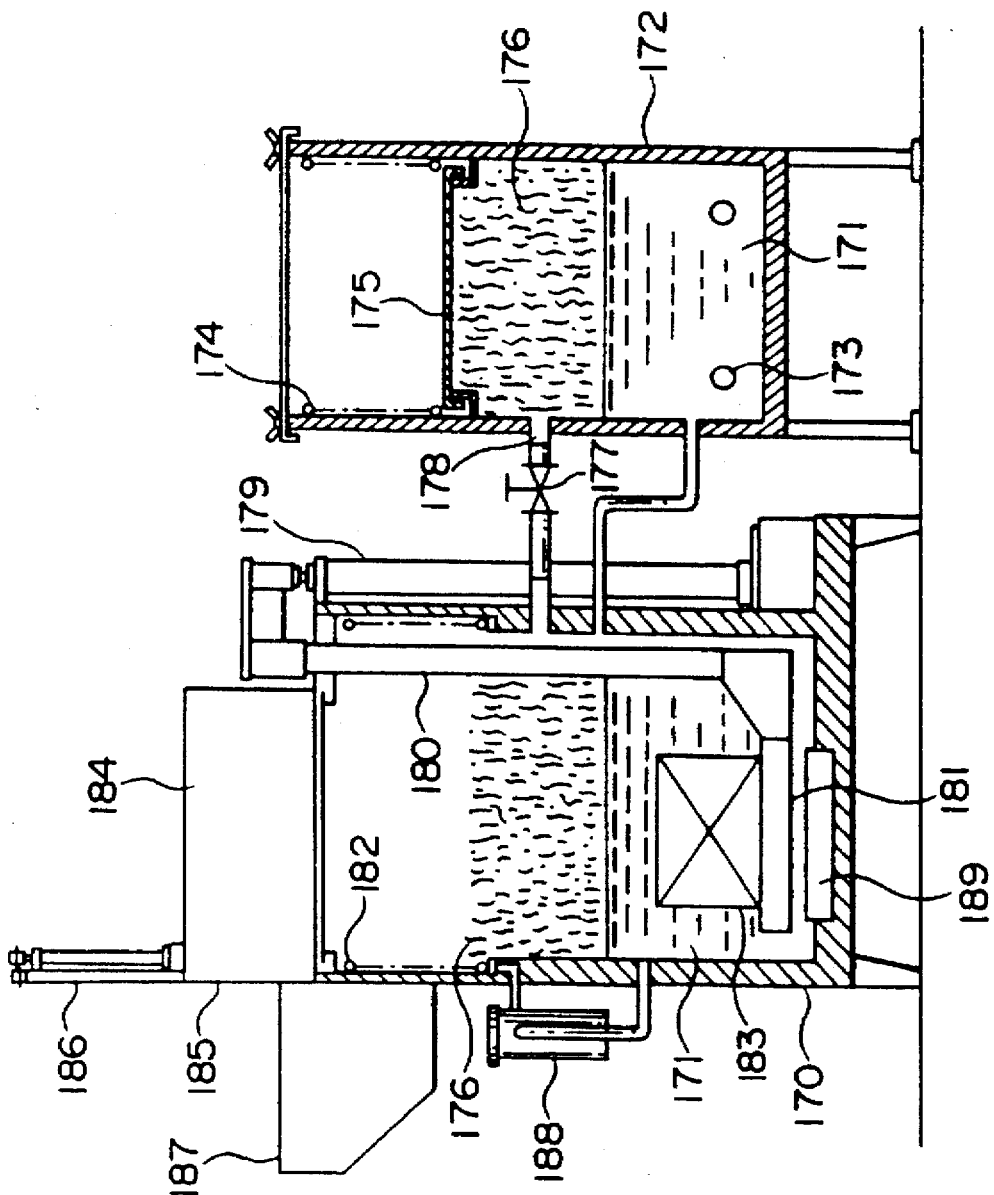
FIG. 8 is a diagram illustrating the construction of a rinsing apparatus as a further embodiment of this invention.

The embodiment described thus far has been depicted as effecting displacement of defiling water by immersion cleaning and shower cleaning and subsequently drying the cleaned surface with the vapor of perfluorocarbon. Optionally, the cleaning and the drying can be accomplished solely by the cleaning with the vapor of perfluorocarbon. In this case, the water on the surface of the part subjected to cleaning is extended and uniformly dried when the vapor of perfluorocarbon is deposited in the form of dews on the surface of the part subjected to cleaning and the surface of the part subjected to cleaning is consequently covered with the perfluorocarbon liquid. The removal of the water is effected as by the floatation of water due to the difference in specific gravity between the water and the perfluorocarbon or the shedding of the water after the deposition of perfluorocarbon in the form of dews. Now, yet another embodiment of this invention will be described below with reference to FIG. 8. FIG. 8 illustrates one example of a cleaning apparatus using perfluorocarbon as a rinsing agent.

In a cleaning bath 170, a rinsing agent 171 having perfluorocarbon as a main component thereof is contained. This cleaning bath 170 is formed separately of a vapor generating bath 172 which contains the same rinsing agent 171 having perfluorocarbon as a main component thereof. A heater 173 for generation of vapor is placed in the rinsing agent 171 contained in the vapor generating bath 172. A cooling coil 174 for cooling and condensing the vapor of perfluorocarbon is set place on the upper inner surface of the vapor generating bath 172. An intermediate lid 175 having a proper weight is disposed so as to be opened and shut between the cooling coil 174 and the rinsing agent 171 filling the vapor generating bath 172. This intermediate lid 175 serves to control the pressure of a nonflammable vapor 176.

The vapor generating bath 172 mentioned above is connected to the cleaning bath 170 via a feed mouth 178 furnished with a switch valve 177 and adapted to supply the vapor 176 of the rinsing agent 171 having perfluorocarbon as a main component thereof. The cleaning bath 170 is provided on the vapor generating bath 172 side thereof with an elevating mechanism 179 using an air cylinder, an oil cylinder and the like.

A vertical lever 180 is connected to the elevating mechanism 179 and adapted to impart a vertical motion to a cleaning base 181 which is fixed to the lower end of the vertical lever 180.

Above the cleaning bath 170, a gateway part 184 for a part 183 subjected to cleaning is seated through the medium of a cooling coil 182 serving to condensate the vapor 176 of the rinsing agent 171. This gateway part 184 is provided with an entrance 185 for allowing reciprocation therethrough of the part 183 subjected to cleaning and a shutter 186 adapted to open and shut the entrance 185. The gateway part 185 is provided with a loading base 187 for mounting thereon the part 183 subjected to cleaning. In the diagram, 188 stands for a water separating device.

In the rinsing device constructed as described above, the part 183 subjected to cleaning which has been cleaned with a varying cleaning agent and consequently covered thereon with the cleaning agent is rinsed by introducing this part 183 of a defiled surface into the device and immersing it in the rinsing agent 171. This immersion is implemented by inserting the part 183 subjected to cleaning from the loading base 187 via the entrance 185 into the gateway part 184, operating the elevating mechanism 179 thereby leveling the cleaning base 181 with the gateway part 184, placing the part 183 subjected to cleaning on the cleaning base 181, and lowering the cleaning base 181 into the rinsing agent 171. This rinsing by the immersion in the rinsing agent 171 can be effected either by vertically oscillating the cleaning stand 181 or exposing the part 183 subjected to cleaning to ultrasonic waves generated by the operation of an ultrasonic oscillator 189.

Though the rinsing of the part 183 subjected to cleaning can be effected solely by immersion in the rinsing agent 171 as described above, it may be attained by the combination of this immersion with vapor cleaning. The rinsing thus performed enables the part 183 subjected to cleaning to be dried easily. The vapor cleaning is accomplished by opening the switch valve 177 thereby introducing into the cleaning bath 170 the vapor 176 of the rinsing agent 171 generated in the vapor generating bath 172 and having perfluorocarbon as a main component thereof.

The rinsing of the part 183 subjected to cleaning may be otherwise effected by spouting the rinsing agent 171 against the part 183 subjected to cleaning instead of immersing the part 183 in the rinsing agent 171 or exposing the part 183 to the vapor of the rinsing agent 171.

Figure 9:
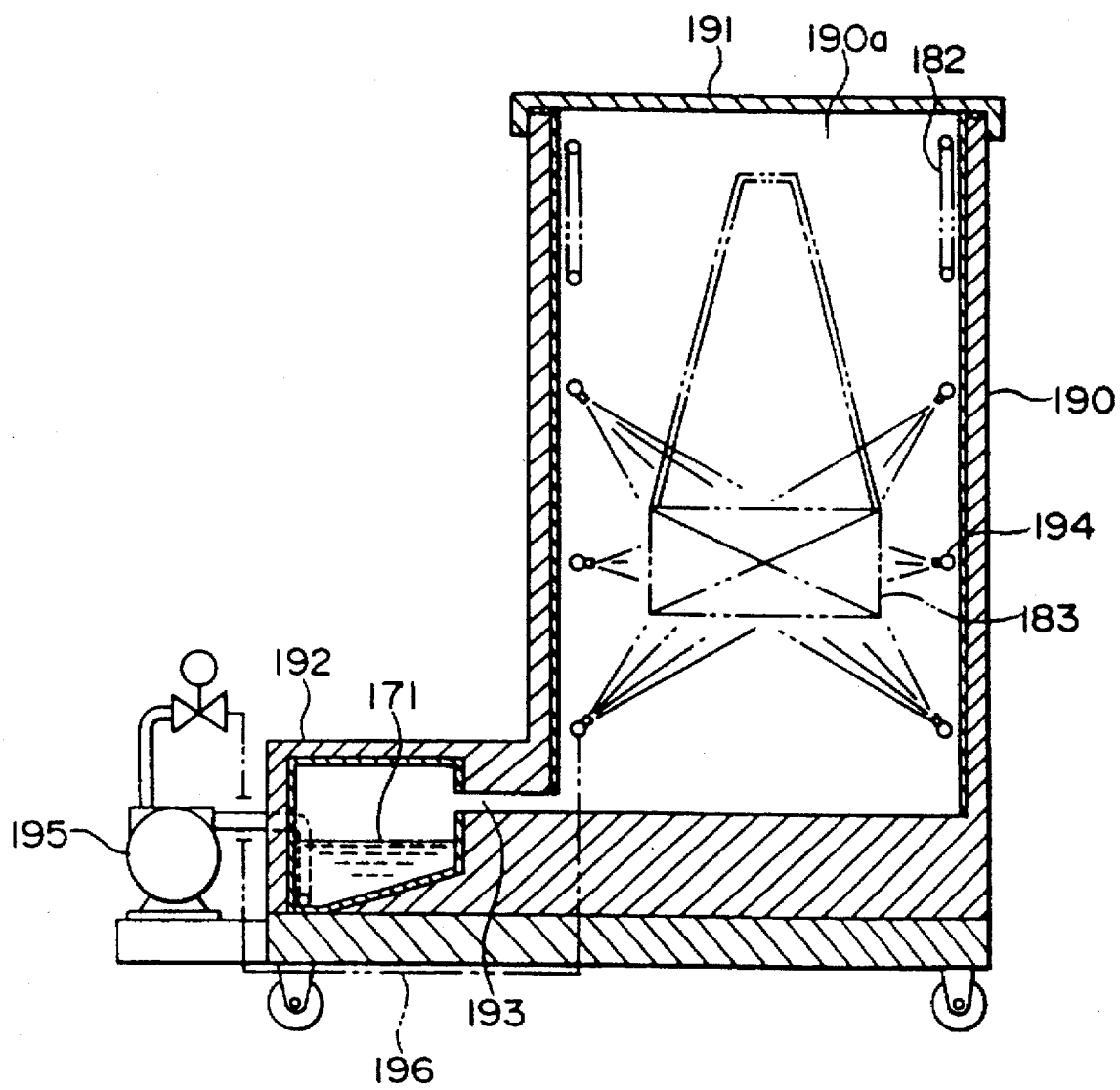
FIG. 9 is a diagram illustrating the construction of another rinsing apparatus of this invention.
Figure 10:
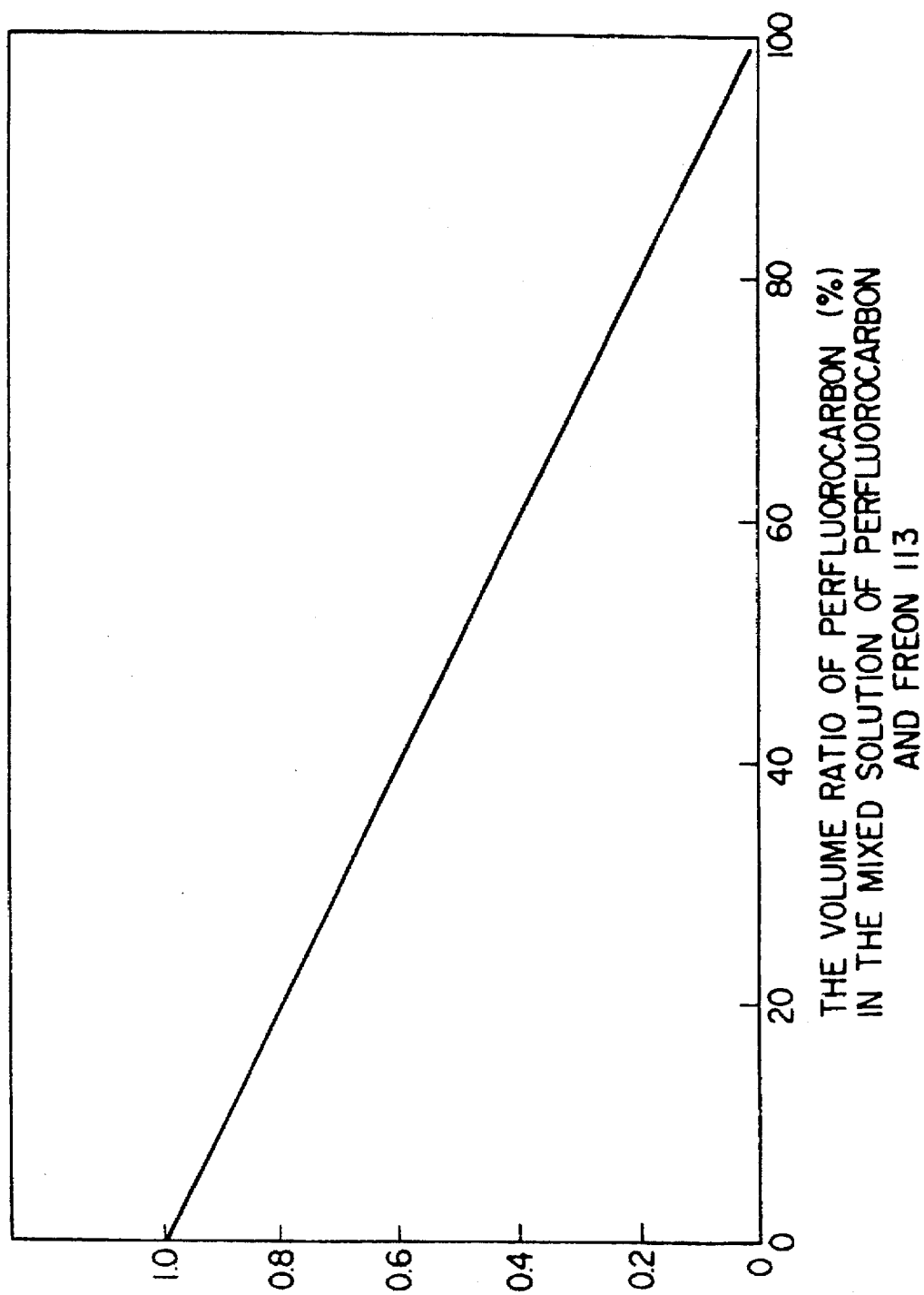
FIG. 10 is a diagram showing the relation between the mixing ratio of perfluorocarbon with Freon 113 and the degree of influence of Freon 113 on the environment.

The rinsing by virtue of the injection of the rinsing agent 171 is implemented by the use of a cleaning bath 190 constructed as illustrated in FIG. 9. An upper end opening 190a of the cleaning bath 190 illustrated in this diagram is adapted to be sealed with a lid 191. This cleaning bath 190 is connected to a cleaning agent container bath 192 holding the rinsing agent 171 composed mainly of perfluorocarbon through the medium of a communicating path 193 laid between the bottom parts. On the inner wall of the cleaning bath 190, spouting nozzles 194 for the rinsing agent 171 are disposed. To the spouting nozzles 194, a spouting pump 195 communicating with the cleaning agent container bath 192 is connected through the medium of conduits 196. The part 183 subjected to cleaning is rinsed by the spouting pump 195 spouting highly compressed the rinsing agent 171 against the part 183 subjected to cleaning.

Now, the results of the cleaning evaluation by using a rinsing apparatus constructed as illustrated in FIG. 8 in the cleaning of sample parts defiled with mineral oil (rolling oil) will be described below.

First, a stainless steel sheet (50 mm×80 mm×1 mm(thickness)) smeared with a mineral oil type defiling was used as a part subjecting to cleaning. A cleaning step and rinsing step for the removal of residual cleaning agent, indicated in Table 4, were performed on the part subjected to cleaning by the separately placed cleaning apparatus. The part was then conveyed into a rinsing apparatus constructed as illustrated in FIG. 8 and subjected therein to a rinsing (drying) step performed under the varying conditions indicated in Table 5. The results of the cleaning were evaluated in terms of the amount of oil adhering to the surface of the cleaned part. The amount of oil used for the evaluation was determined by extracting the oil adhering to the surface of the sample with carbon tetrachloride and measuring the concentration of the removed oil in the extract by the non-dispersion type infrared absorption method. The magnitude found by this determination resulted from reduction to heavy oil B. The results are shown in Table 5. For comparison with the results of this invention, those obtained of parts cleaned with Freon 113 and of parts not cleaned will be described

TABLE 4

| | SAMPLE NO. | CLEANING STEP | | | RINSING STEP FOR REMOVAL OF RESIDUAL CLEANING AGENT RINSING AGENT AND RINSING METHOD |
|---|---|---|---|---|---|
| | | CLEANING AGENT | CLEANING METHOD | CLEANING TIME (IN SECONDS) | |
| EXAMPLE | 1 | SILICONE TYPE CLEANING AGENT, FRW-17 (TOSHIBA) | ULTRASONIC CLEANING (TEMPERATURE 40° C., VOLUME OF AGENT 20 LITERS, ULTRASONIC WAVE 28 kHz, 600 W) | 3 | CLEANING BY SHAKING IN SILICONE TYPE CLEANING AGENT, FRW-1 (TOSHIBA) (TEMPERATURE 30° C., VOLUME OF AGENT 20 LITERS, 60 SECONDS) |
| | 2 | | | 5 | |
| | 3 | | | 10 | |
| | 4 | HYDROCARBON TYPE CLEANING AGENT, CLEAN SORUKE (NIPPON OIL) | ULTRASONIC CLEANING (TEMPERATURE 50° C., VOLUME OF AGENT 20 LITERS, ULTRASONIC WAVE 28 kHz, 600 W) | 10 | CLEANING BY SHAKING IN SILICONE TYPE CLEANING AGENT, FRW-1 (TOSHIBA) (TEMPERATURE 30° C., VOLUME OF AGENT 20 LITERS, 60 SECONDS) |
| | 5 | AQUEOUS TYPE CLEANING AGENT, | ULTRASONIC CLEANING (TEMPERATURE 80° C., | 3 | ULTRASONIC CLEANING WITH TAP WATER (NORMAL WATER TEMPERATURE, |
| | 6 | | | 5 | |

TABLE 4-continued

| | SAMPLE NO. | CLEANING STEP | | CLEANING TIME (IN SECONDS) | RINSING STEP FOR REMOVAL OF RESIDUAL CLEANING AGENT RINSING AGENT AND RINSING METHOD |
| --- | --- | --- | --- | --- | --- |
| | | CLEANING AGENT | CLEANING METHOD | | |
| | 7 | AQUEOUS 10% FINE ACE SOLUTION (SHOWA DENKO) | VOLUME OF AGENT 20 LITERS, ULTRASONIC WAVE 40 TO 90 kHz, 500 W) | 10 | VOLUME OF AGENT 20 LITERS, RUNNING WATER 5 LITERS/ MIN, ULTRASONIC WAVE 40 TO 90 kHz, 500 W, 120 SECONDS) + CLEANING BY SHAKING IN FRW-1 (DISPLACED WITH WATER ) (NORMAL WATER TEMPERATURE, VOLUME OF AGENT 20 LITERS, 120 SECONDS) |
| | 8 | | | 20 | |
| | 9 | | | 30 | |
| | 10 | | | 120 | |
| COMPARATIVE EXPERIMENT | 11 | FREON 113, DAIFRON SE (DAIKIN) | ULTRASONIC CLEANING (TEMPERATURE 40° C., VOLUME OF AGENT 20 LITERS, ULTRASONIC WAVE 40 TO 90 kHz, 500 W) | 3 | CLEANING BY SHAKING IN DAIFRON S3 (NORMAL AGENT TEMPERATURE, VOLUME OF AGENT 20 LITERS, 60 SECONDS) |
| | 12 | | | 5 | |
| | 13 | | | 10 | |
| | 14 | (NO CLEANING) | | | (NO CLEANING) | additionally.

TABLE 5

| | Sample No. | Rinsing (drying) step Cleaning agent and cleaning method | Amount of residual oil per sample (μl) |
| --- | --- | --- | --- |
| Example | 1 | Rinsing by immersion and cleaning by exposure to vapor of FRV-1 (Toshiba) (boiling point 100° C., 60 seconds) | 0.20 |
| | 2 | | 0.10 |
| | 3 | | 0.085 |
| | 4 | | 0.040 |
| | 5 | | 0.19 |
| | 6 | | 0.17 |
| | 7 | | 0.16 |
| | 8 | | 0.12 |
| | 9 | | 0.095 |
| | 10 | | 0.080 |
| Comparative Experiment | 11 | Cleaning by exposure to vapor of Saifron S3 (boiling point 47° C., 60 seconds) | 0.19 |
| | 12 | | 0.13 |
| | 13 | | 0.075 |
| | 14 | (No cleaning) | 1.22 |

Incidentally, though the rinsing by immersion in perfluorocarbon may be omitted as in the cleaning apparatus illustrated in FIG. 1, there are times when better results are obtained by including this step of rinsing as in the embodiment just described above. The cleaning with vapor fails to produce fully desirable results, for example, where the part subjected to cleaning has a small thermal capacity and, in the step of cleaning with the vapor of perfluorocarbon, the part is readily heated to the temperature of the vapor and the vapor is not allowed to be condensed sufficiently. In this case, it is more advantageous to effect the cleaning by additionally resorting to the immersion in perfluorocarbon than by solely resorting to the exposure to the condensate of the vapor.

The results of a trial operation of a rinsing apparatus constructed as illustrated in FIG. 8 in the cleaning of a plastic container for the removal of fine dust adhering to the container will be described below.

A rinsing agent composed mainly of perfluorocarbon and having a boiling point of 56° C. (a product of Kabushiki Kaisha Toshiba marketed under trademark designation of "Technocare FRV-2") was used. Containers of a polycarbonate to which fine dust floating in the room air had adhered were cleaned and dried under the conditions of three minutes' cleaning by immersion and three minutes' cleaning of the foregoing description in a clean room. In accordance with the following scale, the cleaned and dried containers were evaluated by visual observation under a visible light and by visual observation under the light from a UV lamp in a dark room. The results are shown in Table 6. For comparison with this invention, the results similarly obtained severally with Freon 113 and IPA are additionally described.

XX: Presence of at least 0.1 speck of visually discernible dust per $cm^2$ under visible light X: Presence of at most 0.1 speck of visually discernible dust per $cm^2$ under visible light ◯: Presence of at least 0.1 speck of visually discernible dust per $cm^2$ under UV light ⊚: Presence of at most 0.01 speck of visually discernible dust per $cm^2$ under UV light

TABLE 6

| | Example | Comparative Experiment | |
| --- | --- | --- | --- |
| | FRV-2 | Freon 113 | IPA |
| Count of dust | ⊚ | ⊚ | ◯ |

INDUSTRIAL PRACTICABILITY

The cleaning method of this invention produces the same effects (such as impartation of resistance to water mark) as the cleaning with a Freon type solvent and the drying with the vapor of the Freon Type solvent. It conspicuously diminishes the environmental pollution because it uses a cleaning agent having as a main component thereof perfluorocarbon containing substantially no chlorine. Thus, it permits ultraprecision cleaning to be effected with great safety inclusive of the influence on the environment.

What is claimed is:

1. A method of cleaning a metal, electronic, semiconductor, ceramic, glass, plastic, optical or surface-treated part comprising the steps of:

a) cleaning the part in an immersion bath by use of a cleaning agent consisting essentially of a selected from at least one of the group consisting of perfluorocarbons, hydrocarbons, and silicones, and b) drying said part by the use of a vapor drying agent comprising perfluorocarbons, wherein during said drying said vapor drying agent condenses on the part and at a temperature below the boiling point of the perfluorocarbon, forms a miscible blend with said cleaning agent which remains on the part after step (a), and wherein said blend washes off the surface of the part, thereby drying and cleaning said part.

2. A method according to claim 1, wherein said vapor drying agent consists essentially of a perfluorocarbon.

3. A method according to claim 1, wherein said solvent comprises a perfluorocarbon.

4. A method according to claim 1, wherein said solvent comprises a hydrocarbon.

5. A method according to claim 4, wherein said hydrocarbon comprises a terpene.

6. A method according to claim 4, wherein said hydrocarbon comprises kerosene.

7. A method according to claim 1, further comprising a rinsing step between said steps (a) and (b), wherein said rinsing step comprises rinsing the part in an immersion bath with a rinsing agent comprising a solvent selected from at least one of the groups consisting of perfluorocarbons, hydrocarbons, and silicones, wherein during said drying said vapor drying agent condenses on the part, and at a temperature below the boiling point of the perfluorocarbon forms a miscible blend with any cleaning agent and rinsing agent remaining on the part, and wherein said blend washes off the surface of the part, thereby drying and cleaning said part.

8. A method according to claim 1, wherein perfluorocarbon has a boiling point of at least 20° C. lower than the solvent.

9. A method according to claim 1, wherein step (a) comprises at least one form of cleaning selected from the group consisting of cleaning for degreasing, cleaning for draining, and precision cleaning.

10. A method according to claim 4, wherein said hydrocarbon comprises a hydrocarbon having from 4 to 30 carbon atoms.

11. A method according to claim 1, wherein said solvent comprises a silicone.

12. A method according to claim 11, wherein said silicone comprise at least one of polyorganosiloxane selected from the group consisting of a straight chain polyorganosiloxane represented by the formula:

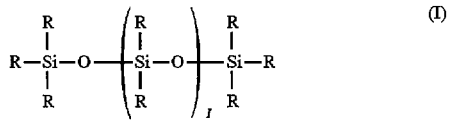

and a cyclic polyorganosiloxane represented by the formula:

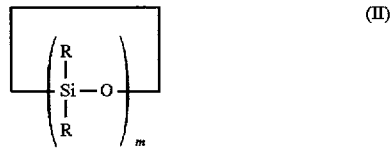

wherein R in each formula is independently a substituted or unsubstituted monovalent hydrocarbon group, I is an integer from 0 to 5, and m is an integer from 3 to 7.

13. A method according to claim 1, wherein the part to be cleaned contains water adhering to the part's surface and such water is removed by the cleaning process.

14. A method according to claim 1, which is a continuous process, wherein the solvent and perfluorocarbon drying agent are recycled during the process.

15. A method according to claim 1, wherein perfluorocarbon has a boiling point of at least 50° C. lower than the boiling point of the solvent.

16. A method according to claim 3, wherein said solvent comprise a perfluorocarbon and an auxiliary agent for improving the cleaning ability or draining property of the perfluorocarbon.

17. A method according to claim 16, wherein the auxiliary agent comprises not more than 70% by volume of the perfluorocarbon and is selected from the group consisting of silicones and hydrocarbons.

18. A method according to claim 1, wherein the part to be cleaned contains grease or oil adhering to the part's surface and such grease or oil is removed by the cleaning process.

19. A method according to claim 1, wherein step (a) further comprises application to the part of one or more of ultrasonic waves, vibrations, or mechanical agitation.

20. A method according to claim 1, wherein said part is a metal part.

21. A method according to claim 1, wherein said part is an electronic part or a semiconductor part.

22. A method according to claim 4, wherein the hydrocarbon comprises a paraffin.

23. A method according to claim 22, wherein the paraffin comprises an isoparaffin having 4 to 30 carbon atoms.

24. A method according to claim 1, wherein the cleaning agent further comprises at least one of a surfactant or hydrophilic solvent in a cleaning-ability-improving amount.

25. A method according to claim 24, wherein the cleaning agent comprises at least one of said silicones or said hydrocarbons.

26. A method according to claim 7, wherein said rinsing step comprises rinsing the part with a perfluorocarbon.

27. A method according to claim 26, wherein the step of rinsing with perfluorocarbon comprises at least one of the steps of immersing the part in perfluorocarbon, exposing the cleaned part to vapor obtained by heating the perfluorocarbon, or directing the perfluorocarbon against the surface of the cleaned part.

28. A method according to claim 7, wherein said rinsing step comprises rinsing the part with a hydrocarbon.

29. A method according to claim 7, wherein said rinsing step comprises rinsing the part with a silicone.

30. A method according to claim 1, wherein said drying step b) consists essentially of use of said vapor cleaning agent and wherein said vapor cleaning agent consists essentially of perfluorocarbon.

31. A method according to claim 1, wherein said solvent consists essentially of a perfluorocarbon.

32. A method according to claim 1, wherein said solvent consists essentially of a hydrocarbon.

33. A method according to claim 1, wherein said solvent consists essentially of a silicone.

34. A method according to claim 7, which is a continuous process, wherein the rinsing and cleaning solvents and the perfluorocarbon drying agent are recycled during the process.

35. A method according to claim 1, wherein said part is a metal, ceramic, glass, or plastic part.

36. A method according to claim 4, wherein the hydrocarbon comprises an alkylbenzene.

37. A method according to claim 7, wherein the cleaning solvent consists essentially of a perfluorocarbons and the rinsing solvent consists essentially of a perfluorocarbon.

38. A method according to claim 1, wherein step (a) comprises ultrasonic cleaning.

39. A method according to claim 7, wherein the cleaning agent consists essentially of one or more of the group consisting of hydrocarbons and silicones and the rinsing agent consists essentially of one or more of the group consisting of hydrocarbons and silicones.

40. A method according to claim 39, wherein the cleaning agent consists essentially of a silicone and the rinsing agent consists essentially of a silicone.

41. A method according to claim 39, wherein the cleaning agent consists essentially of a hydrocarbon and the rinsing agent consists essentially of a hydrocarbon.

42. A method according to claim 12, wherein R is independently selected from the group consisting of methyl, ethyl, propyl, butyl, phenyl, and trifluoro-methyl.

43. A method according to claim 3, wherein said cleaning agent is nonaqueous.

44. A method according to claim 4, wherein said cleaning agent is nonaqueous.

45. A method according to claim 11, wherein said cleaning agent is nonaqueous.

46. A method according to claim 7, wherein said rinsing agent is nonaqueous.

47. A method according to claim 1, further comprising after the drying step b), the step of separating the perfluorocarbon drying agent and solvent in liquid form and recovering the perfluorocarbon and solvent for reuse.

48. A method according to claim 1, wherein the part comprises a ceramic part.

49. A method according to claim 1, wherein the part comprises an optical part.

50. A method according to claim 1, wherein the part comprises a glass part.

51. A method according to claim 1, wherein the part comprises a surface-treated part.

52. A method according to claim 23, wherein the isoparaffin has a fraction of $C_4$ to $C_{15}$ as a main component.

53. A method of cleaning a metal, electronic, semiconductor, ceramic, glass, plastic, optical or surface-treated part comprising the step of cleaning the part in an immersion bath with a cleaning agent consisting essentially of an inflammable solvent selected from the group consisting of hydrocarbons and silicones, wherein the cleaning is carried out in an atmosphere of an inactive vapor resulting from thermal vaporization of perfluorocarbon, such that inactive vapor condenses on the part, and at a temperature below the boiling point of the perfluorocarbon, forms a miscible blend with said cleaning agent, and wherein said blend washes off the surface of the part, thereby drying and cleaning said part.

54. A method according to claim 53, further comprising the step of rinsing said part subjected to cleaning in an immersion bath with a rinsing agent comprising at least one solvent selected from the group consisting of perfluorocarbons, hydrocarbons, and silicones, after said step of cleaning is carried out.

55. A method according to claim 53, wherein said cleaning agent comprises a silicone.

56. A method according to claim 53, wherein said cleaning agent comprises a hydrocarbon.

57. A method according to claim 56, wherein said hydrocarbon comprises a terpene.

58. A method according to claim 56, wherein said hydrocarbon comprises kerosene.

59. A method according to claim 56, wherein said hydrocarbon comprises a hydrocarbon having from 4 to 30 carbon atoms.

60. A method according to claim 55, wherein said silicone comprises at least one polyorganosiloxane selected from the group consisting of a straight chain polyorganosiloxane represented by the formula:

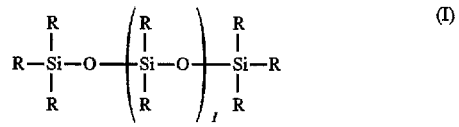

and a cyclic polyorganosiloxane represented by the formula:

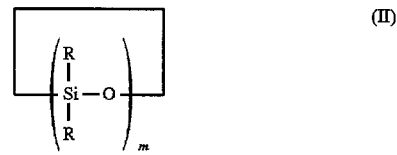

wherein R in each formula is independently a substituted or unsubstituted monovalent hydrocarbon group, I is an integer from 0 to 5, and m is an integer from 3 to 7.

61. A method according to claim 53, wherein said perfluorocarbon has a boiling point at least 20° C. lower than the boiling point of the solvent.

62. A method according to claim 53, wherein the cleaning step comprises one or more selected from the group of cleaning for degreasing, cleaning for draining, and precision cleaning.

63. A method according to claim 53, wherein said atmosphere contains substantially no oxygen.

64. A method according to claim 54, wherein said rinsing is carried out in an atmosphere of an inactive vapor resulting from thermal vaporization of perfluorocarbon.

65. A method according to claim 54, wherein said rinsing agent comprises a silicone.

66. A method according to claim 54, wherein said rinsing agent comprises a hydrocarbon.

67. A method according to claim 54, wherein said rinsing agent comprises a terpene.

68. A method according to claim 54, wherein said rinsing agent comprises kerosene.

69. A method according to claim 53, wherein said part comprises a metal, ceramic, glass, or plastic part.

70. A method according to claim 53, wherein said part comprises a metal part.

71. A method according to claim 53, wherein said part comprises an electronic part or a semiconductor part.

72. A method according to claim 53, wherein said atmosphere consists essentially of perfluorocarbon vapor.

73. A method according to claim 53, wherein said part comprises a ceramic part.

74. A method according to claim 53, further comprising a step of recovering the solvent and perfluorocarbon and recycling them to the method.

75. A method according to claim 1, wherein said drying occurs at a temperature near the boiling point of the perfluorocarbon.

76. A method according to claim 1, wherein the perfluorocarbon drying agent contains only fluorine and carbon atoms.

77. A method according to claim 1, wherein the perfluorocarbon drying agent in addition to fluorine and carbon atoms, contains one or more of hydrogen, chlorine, and bromine atoms.

78. A method according to claim 1, wherein the perfluorocarbon drying agent in addition to fluorine and carbon atoms, contains hydrogen atoms.

79. A method according to claim 1, wherein the perfluorocarbon drying agent in addition to fluorine and carbon atoms, contains 0.5 to 5.0% of hydrogen.

80. A method according to claim 53, wherein the perfluorocarbon contains only fluorine and carbon atoms.

81. A method according to claim 53, wherein the perfluorocarbon in addition to fluorine and carbon atoms, contains one or more of hydrogen, chlorine, and bromine atoms.

82. A method according to claim 53, wherein the perfluorocarbon in addition to fluorine and carbon atoms, contains hydrogen atoms.

83. A method according to claim 53, wherein the perfluorocarbon drying agent in addition to fluorine and carbon atoms, contains 0.5 to 5.0% of hydrogen.

84. A method according to claim 1, wherein the part is an industrial part.

85. A method according to claim 53, wherein the part is an industrial part.

86. A method according to claim 25, wherein the cleaning agent further comprises fatty acid esters.

87. A method according to claim 7, wherein the cleaning agent further comprises fatty acid esters.

88. A method according to claim 53, wherein the cleaning agent further comprises fatty acid esters.

* * * * *

UNITED STATES PATENT AND TRADEMARK OFFICE
CERTIFICATE OF CORRECTION

PATENT NO. :    5,690,750
DATED      :    November 25, 1997
INVENTOR(S):    Minoru INADA et al.

It is certified that error appears in the above-identified patent and that said Letters Patent is hereby corrected as shown below:

On title page, item
 [30], contains a typographical error wherein "August 20, 1990" should read --August 30, 1990--.

Signed and Sealed this

Twenty-fourth Day of February, 1998

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. :   5,690,750                          Page 1 of 2
DATED      :   November 25, 1997
INVENTOR(S):   Minoru INADA, et al.

It is certified that error appears in the above-identified patent and that said Letters Patent is hereby corrected as shown below:

Column 12: line 28, delete "cleaning, for nearly satisfactory cleaning, and α for insufficient cleaning" and insert --cleaning, O for nearly satisfactory cleaning, and Δ for insufficient cleaning.--; line 39, delete "(PQ-Z-7)" and insert --(PO-Z-7)-- and line 62, delete "mark, for absence of visually" and insert --mark, O for absence of visually--.

Column 18: line 7, delete "(FC-75)" and insert --(FRV-1)-- line 22, delete "coutnertype" and insert --countertype--; line 27, delete "Operational" and insert --operational--.

UNITED STATES PATENT AND TRADEMARK OFFICE
CERTIFICATE OF CORRECTION

PATENT NO. : 5,690,750
DATED : November 25, 1997
INVENTOR(S) : Minoru Inada, et al It is certified that error appears in the above-indentified patent and that said Letters Patent is hereby corrected as shown below:

Column 21: Table 4, Sample No. 12, delete "SE (DAIKIN)" and insert --S3 (DAIKIN)--; Column 22, line 35, delete ":Presence" and insert -- 0: Presence--.

Signed and Sealed this

Twenty-first Day of July, 1998

Attest:

BRUCE LEHMAN

*Attesting Officer*  *Commissioner of Patents and Trademarks*